United States Patent
Ohmi et al.

(10) Patent No.: US 9,741,900 B2
(45) Date of Patent: Aug. 22, 2017

(54) NITRIDE SEMICONDUCTOR LIGHT EMITTING ELEMENT

(71) Applicant: Sharp Kabushiki Kaisha, Sakai, Osaka (JP)

(72) Inventors: Susumu Ohmi, Sakai (JP); Takashi Kurisu, Sakai (JP); Masayuki Nagata, Sakai (JP)

(73) Assignee: Sharp Kabushiki Kaisha, Sakai (JP)

( * ) Notice: Subject to any disclaimer, the term of this patent is extended or adjusted under 35 U.S.C. 154(b) by 0 days.

(21) Appl. No.: 15/128,138

(22) PCT Filed: Dec. 18, 2014

(86) PCT No.: PCT/JP2014/083549
§ 371 (c)(1),
(2) Date: Sep. 22, 2016

(87) PCT Pub. No.: WO2015/145899
PCT Pub. Date: Oct. 1, 2015

(65) Prior Publication Data
US 2017/0098737 A1    Apr. 6, 2017

(30) Foreign Application Priority Data

Mar. 24, 2014  (JP) .................................. 2014-059562
Nov. 26, 2014  (JP) .................................. 2014-238401

(51) Int. Cl.
*H01L 33/38*     (2010.01)
*H01L 33/00*     (2010.01)
(Continued)

(52) U.S. Cl.
CPC .......... *H01L 33/38* (2013.01); *H01L 33/0075* (2013.01); *H01L 33/14* (2013.01);
(Continued)

(58) Field of Classification Search
None
See application file for complete search history.

(56) References Cited

U.S. PATENT DOCUMENTS

2005/0212002 A1    9/2005 Sanga et al.
2008/0185606 A1*   8/2008 Sano ..................... H01L 33/42
                                                    257/98
(Continued)

FOREIGN PATENT DOCUMENTS

JP    2000-114595 A    4/2000
JP    2005-317931 A    11/2005
(Continued)

OTHER PUBLICATIONS

Official Communication issued in International Patent Application No. PCT/JP2014/083549, mailed on Jan. 20, 2015.

*Primary Examiner* — Khaja Ahmad
(74) *Attorney, Agent, or Firm* — Keating & Bennett, LLP

(57) ABSTRACT

A nitride semiconductor light emitting element 1 includes a second conductivity type nitride semiconductor layer which is formed above a first conductivity type nitride semiconductor layer, a first electrode 17a which is formed on a first region of the second conductivity type nitride semiconductor layer with a first current non-injection layer 13a in between, a first current diffusing layer 14a which is formed between the first current non-injection layer 13a and the first electrode 17a, a second electrode 17b which is formed on a second region of the second conductivity type nitride semiconductor layer with a second current non-injection layer 13b in between, a second current diffusing layer 14b which is formed on the second region and on the second current non-injection layer 13b, and an extending portion 17c which extends from the first electrode 17a and reaches the exposed first conductivity type nitride semiconductor layer.

9 Claims, 46 Drawing Sheets

(51) Int. Cl.
*H01L 33/14* (2010.01)
*H01L 33/20* (2010.01)
*H01L 33/32* (2010.01)
*H01L 33/62* (2010.01)

(52) U.S. Cl.
CPC .............. *H01L 33/20* (2013.01); *H01L 33/32* (2013.01); *H01L 33/62* (2013.01); *H01L 2224/05* (2013.01); *H01L 2224/48463* (2013.01)

(56) References Cited

U.S. PATENT DOCUMENTS

| | | |
|---|---|---|
| 2011/0156070 A1 | 6/2011 | Yoon et al. |
| 2011/0233596 A1 | 9/2011 | Sano et al. |
| 2012/0248490 A1* | 10/2012 | Weng ............... H01L 33/38 257/99 |
| 2015/0091038 A1 | 4/2015 | Yoon et al. |
| 2016/0079467 A1* | 3/2016 | Totani ............... H01L 33/32 257/76 |

FOREIGN PATENT DOCUMENTS

| | | |
|---|---|---|
| JP | 2008-192710 A | 8/2008 |
| JP | 2010-232642 A | 10/2010 |
| JP | 2011-139037 A | 7/2011 |
| WO | 2010/100900 A1 | 9/2010 |

\* cited by examiner

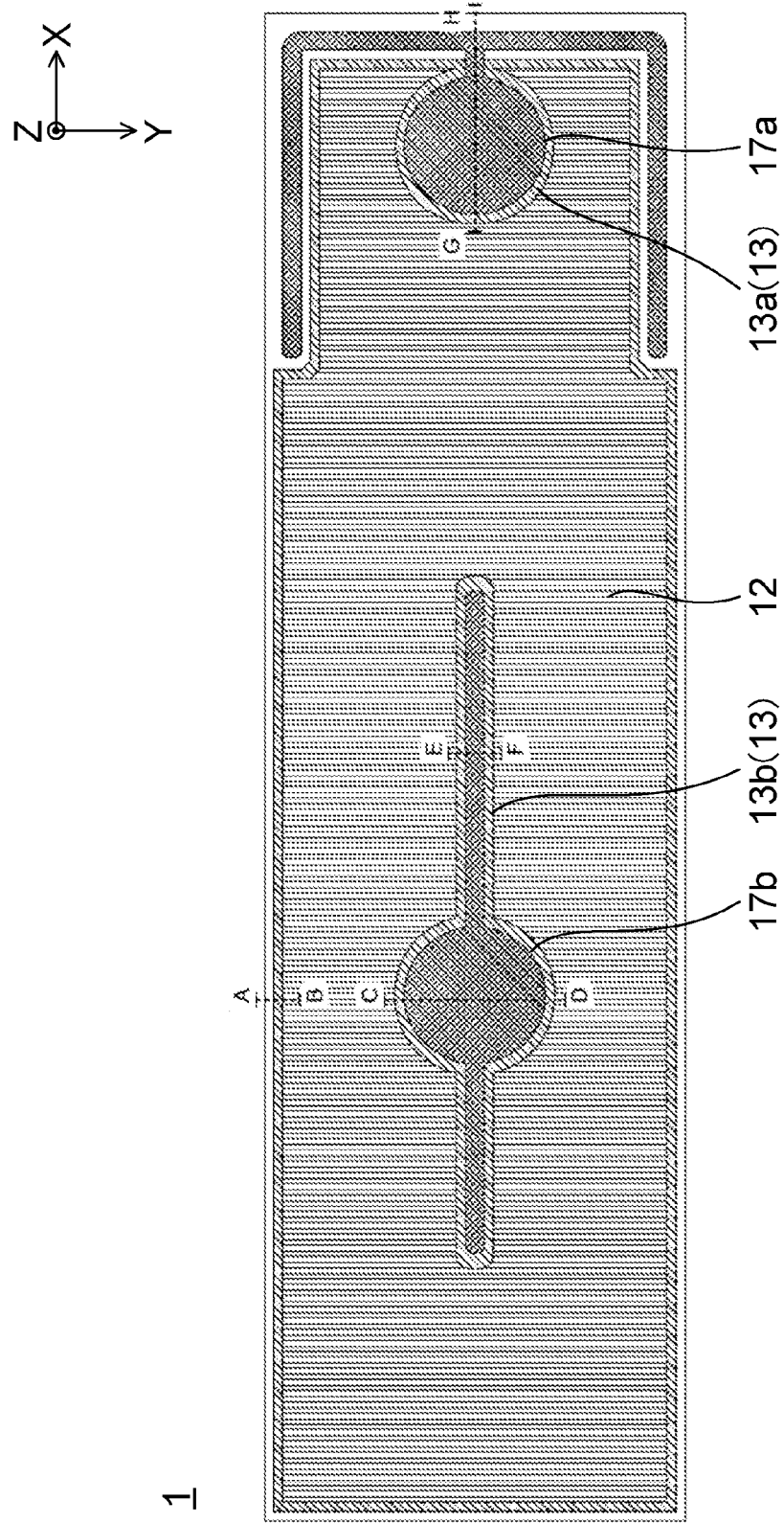

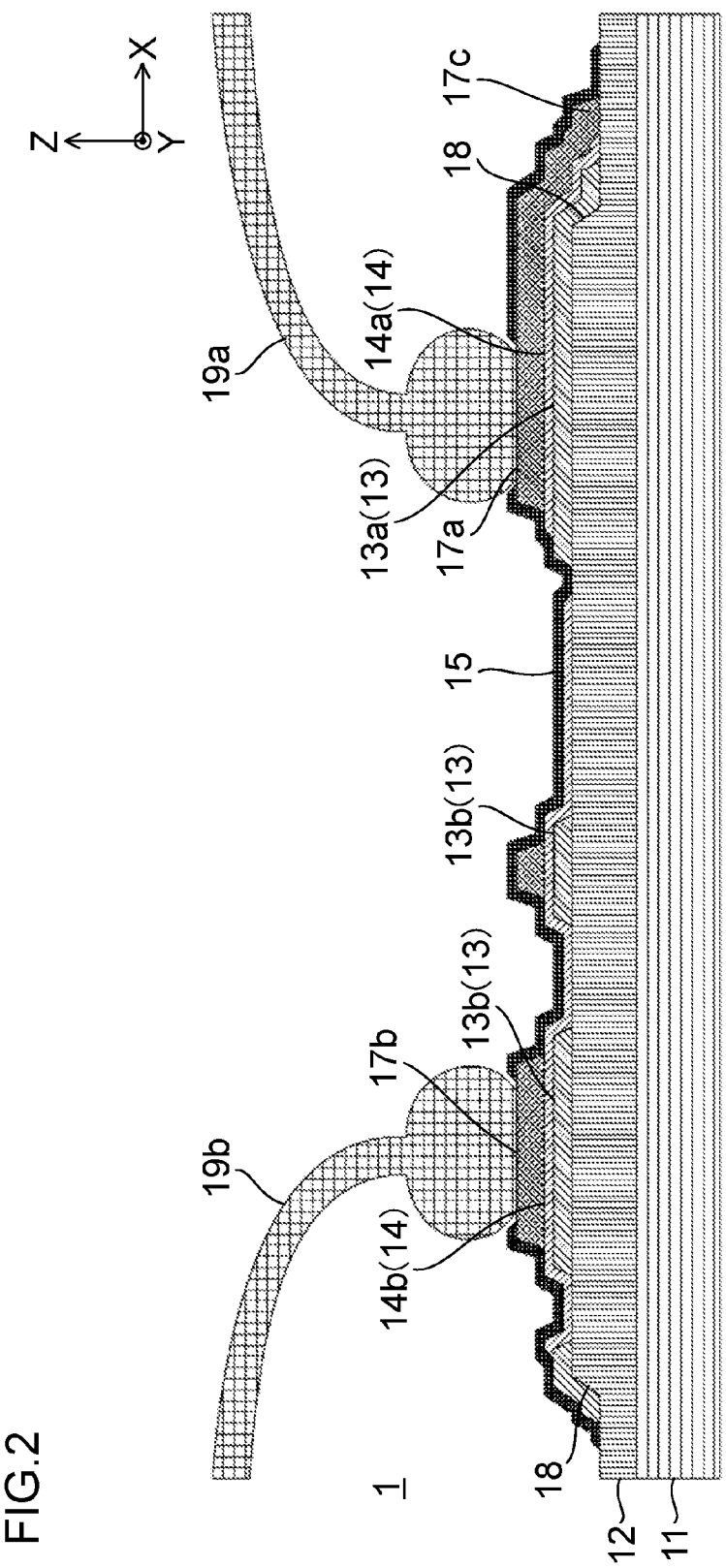

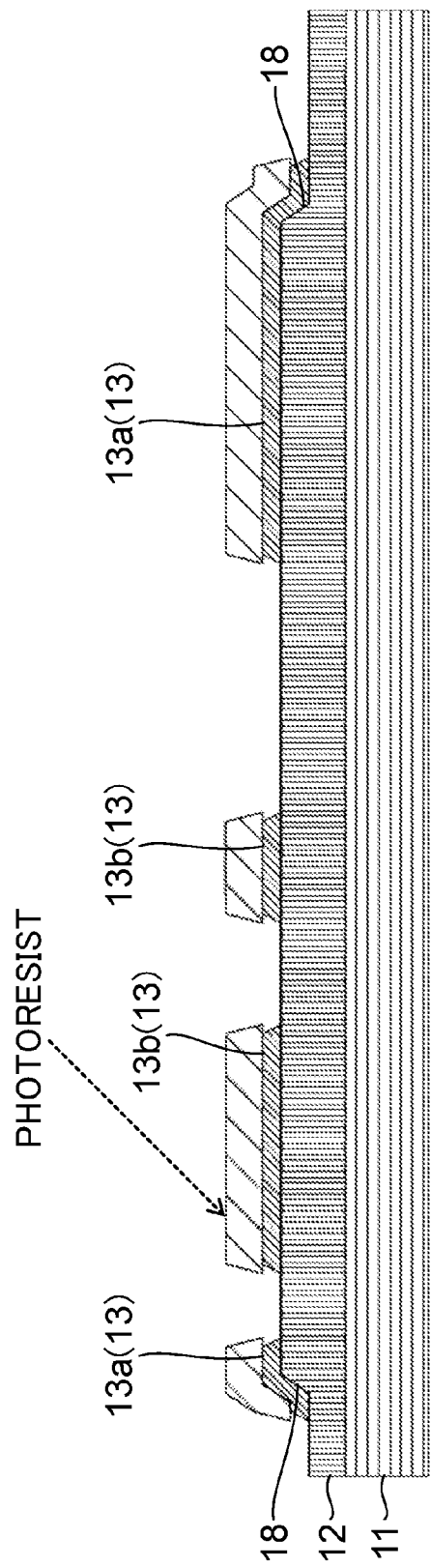

NITRIDE SEMICONDUCTOR LIGHT EMITTING ELEMENT

TECHNICAL FIELD

The present invention relates to a semiconductor light emitting element and a method of manufacturing the same, and particularly, to a nitride semiconductor light emitting element that is manufactured using a nitride semiconductor material.

BACKGROUND ART

Recently, a white light emitting apparatus, in which a blue light emitting element that uses a nitride semiconductor element as a light emitting element and a phosphor are used, is generally used for a backlight of a large-sized liquid crystal television, a light source for lighting, and the like. A large number of white light emitting apparatuses are used for each of the products such as a large-sized liquid crystal television, lighting, and the like. Therefore, it is desired that the blue light emitting element being used for these products can be mass-produced with good quality and emit light with higher efficiency.

Such a nitride semiconductor light emitting element includes, for example, an n-type nitride semiconductor layer, a light emitting layer, and a p-type nitride semiconductor layer which are sequentially stacked on an insulating sapphire substrate. An n-side electrode and a p-side electrode for being connected to an external power source are formed on the n-type nitride semiconductor layer and the p-type nitride semiconductor layer, respectively.

Since a sheet resistance of the p-type nitride semiconductor layer is generally higher than that of the n-type nitride semiconductor layer, a transparent electrode layer made of, for example, indium tin oxide (ITO), or the like is stacked substantially on the entire upper surface of the p-type nitride semiconductor layer for the purpose of assisting current diffusion inside the p-type nitride semiconductor layer, and the p-side electrode is formed on the transparent electrode layer. Such a transparent electrode layer transmits light from the light emitting layer, and functions as a current diffusing layer.

In a case where an insulation substrate such as a sapphire substrate is used for the nitride semiconductor light emitting element, the n-side electrode is not able to be formed on a rear surface of the substrate, and thus the n-side electrode is formed on a main surface on the same side as the p-side electrode being formed. For example, a region of a p-type semiconductor layer and the light emitting layer are partially removed by etching, the n-type nitride semiconductor layer is partially exposed, and the n-side electrode is formed on the exposed region.

However, in such a configuration, there is a problem in that current is concentrated on a part where the n-side electrode is formed in the n-type nitride semiconductor layer.

In addition, since the n-side electrode and the p-side electrode are formed to be relatively thick using a metal material such as Au, Al, Ni, or Ti, light emitted from the light emitting layer is reflected at a certain reflectivity without being transmitted through the n-side electrode or the p-side electrode. Therefore, there is a problem in that loss on a light extraction efficiency of the nitride semiconductor light emitting element is great due to light absorption by the n-side electrode or the p-side electrode.

Accordingly, in PTL 1, it is proposed that light extraction efficiency is improved by providing the transparent conductive film right under the n-side electrode and the p-side electrode in order to suppress light absorption by the n-side electrode or the p-side electrode.

However, when the nitride semiconductor light emitting element in which the electrodes are disposed as described above is mounted face-up, the n-side electrode and the p-side electrode require a certain area for wire-bonding. Particularly, in order to secure a certain area for connecting the n-side electrode, an exposed region of the n-type nitride semiconductor layer needs to be provided in accordance with the secured area, and compared to a light emitting element having a so-called an up-and-down electrode structure in which an electrode is formed on a rear surface of a substrate using a conductive substrate, if the same light output is intended to be obtained, there is a problem in that the size of chip may be large. In addition, in a case where the size of chip is not increased, since a light emitting area of the nitride semiconductor light emitting element is small-sized as the exposed region of the n-type nitride semiconductor layer is made large, a problem of deteriorating the light extraction efficiency of the nitride semiconductor light emitting element is generated, but there is no consideration for such a problem.

Regarding the light extraction efficiency, in PTL 1, under the n-side electrode and the p-side electrode, a first transparent electrode layer, which functions as the current diffusing layer and a second transparent electrode layer for suppressing light absorption by the n-side electrode or the p-side electrode are separately formed. Further, since the n-type semiconductor layer and the p-type semiconductor layer have a work function different from each other, different pretreatment processes for ohmic contact between each electrode and the transparent electrode layer is necessary under the n-side electrode and under the p-side electrode. Therefore, there is a problem in that the number of processes is increased, a manufacturing process is complicated, and a manufacturing cost is increased.

PTL 2 discloses a light emitting diode including a lower semiconductor layer which is formed on a substrate, an upper semiconductor layer which is disposed on the lower semiconductor layer such that at least a part of an edge region of the lower semiconductor layer is exposed, a first electrode which is formed above a part of the region of the upper semiconductor layer with an insulating layer in between and is formed for supplying current to the lower semiconductor layer, a second electrode which is formed above another part of the region of the upper semiconductor layer and is formed to supply current to the upper semiconductor layer, and an extending portion of the first electrode which extends from the first electrode and is formed to reach at least a part of the exposed lower semiconductor layer.

According to the light emitting diode of PTL 2, when the electrodes and the extending portion for supplying current to the lower semiconductor layer are formed, the electrodes and the extending portion are formed above the upper semiconductor layer with an insulating layer in between. Accordingly, reduction in the light emitting area caused by reduction in an area of the semiconductor layer, which is removed by mesa etching for forming the electrodes and the extending portion, can be suppressed.

CITATION LIST

Patent Literature

PTL 1: Japanese Unexamined Patent Application Publication No. 2005-317931

PTL 2: Japanese Unexamined Patent Application Publication No. 2011-139037

SUMMARY OF INVENTION

Technical Problem

However, in the configuration of the invention described in PTL 2, there is a problem in that reflection of light from the light emitting layer on the rear surface side (side facing semiconductor layer) of the electrodes is not sufficient, and light extraction efficiency to the outside is not improved as much as intended. In PTL 2, in order to solve the problem, it is disclosed that an insulating film to be formed between an electrode and a semiconductor layer is provided to have a multilayer structure or an insulating layer of a DBR structure is further provided so that reflectivity on the rear surface side of the electrode can be improved. However, if such a multilayer structure is further added, a manufacturing process becomes complicated, which may disadvantageously cause an increase in the number of processes and a decrease in the yield.

The invention is made to address the above problems, and an object thereof is to provide a nitride semiconductor light emitting element which secures the maximum light emitting area, improves reflectivity of light from the light emitting layer under the electrode, and is capable of further improving light extraction efficiency to the outside, without increasing the size of a chip, and a method of manufacturing the nitride semiconductor light emitting element in which manufacturing processes of the related art are not significantly changed.

Solution to Problem

In order to achieve the object described above, a nitride semiconductor light emitting element according to the present invention includes a substrate, a first conductivity type nitride semiconductor layer that is formed on the substrate, an active layer that is formed on the first conductivity type nitride semiconductor layer, a second conductivity type nitride semiconductor layer that is formed on the active layer, an exposed portion on the first conductivity type nitride semiconductor layer that is exposed by removing a part of the second conductivity type nitride semiconductor layer and the active layer, a first current non-injection layer that is formed on a region on the second conductivity type nitride semiconductor layer, a first current diffusing layer that is formed on the first current non-injection layer, a second current diffusing layer that is formed on another region on the second conductivity type nitride semiconductor layer, a first electrode that is formed on the first current diffusing layer, a second electrode that is formed on the second current diffusing layer, and an extending portion of the first electrode that extends from the first electrode and is formed to reach a part of the exposed portion on the first conductivity type nitride semiconductor layer.

The nitride semiconductor light emitting element of the invention may further include a second current non-injection layer that is formed between the other region of the second conductivity type nitride semiconductor layer and the second current diffusing layer.

The nitride semiconductor light emitting element of the invention may further include an extending portion of the second electrode which extends from the second electrode and is formed on the second conductivity type nitride semiconductor layer.

In the nitride semiconductor light emitting element of the invention, the first current non-injection layer may be formed on a region on the second conductivity type nitride semiconductor layer, and on a region of the exposed portion on the first conductivity type nitride semiconductor layer.

In the nitride semiconductor light emitting element of the invention, the first current diffusing layer may be formed on only a region of the second conductivity type nitride semiconductor layer.

In the nitride semiconductor light emitting element of the invention, the first current diffusing layer may be formed below the first electrode and the extending portion of the first electrode.

In the nitride semiconductor light emitting element of the invention, the first current diffusing layer may be separately formed below the first electrode and below the extending portion of the first electrode in a stepped portion which is formed from an upper surface of the second conductivity type nitride semiconductor layer to reach the exposed portion on the first conductivity type nitride semiconductor layer.

Further, in order to achieve the object described above, a method of manufacturing the nitride semiconductor light emitting element according to the invention includes simultaneously forming the first current diffusing layer and the second current diffusing layer.

A method of manufacturing the nitride semiconductor light emitting element according to the invention includes simultaneously forming the first current non-injection layer and the second current non-injection layer.

According to the above configuration, when a part of the first electrode electrically connected to the first conductivity type nitride semiconductor layer is formed on a part on the first region of the second conductivity type nitride semiconductor layer with the first current non-injection layer in between, reduction in the light emitting area due to the formation of the first electrode can be minimized, and when, between the nitride semiconductor layer and the first electrode and the second electrode, the first current non-injection layer and the second current non-injection layer are formed and then the first current diffusing layer and the second current diffusing layer are formed thereon, light absorption caused by the current diffusing layer under the first electrode and the second electrode can be further reduced. Accordingly, the nitride semiconductor light emitting element which secures the maximum light emitting area, improves the reflectivity of light from the light emitting layer under the first electrode and the second electrode, and is capable of further improving light extraction efficiency to the outside without increasing the size of a chip can be easily obtained.

In addition, since a plurality of layers such as a DBR film are not required to be formed under the first electrode and the second electrode, and the first current diffusing layer and the second current diffusing layer or the first current non-injection layer and the second current non-injection layer are simultaneously formed, light extraction efficiency from the nitride semiconductor light emitting element can be improved without adding complicated film forming processes, and thus the nitride semiconductor light emitting element of working processes and the number of working processes same as those of the related art, high yield, and high reliability can be obtained.

Advantageous Effects of Invention

According to the present invention, the nitride semiconductor light emitting element which secures a maximum light emitting area and is capable of further improving light extraction efficiency without increasing the size of a chip, and a method of manufacturing the nitride semiconductor light emitting element can be easily obtained.

Also, light absorption under the electrode can be reduced by providing the current diffusing layer on the current non-injection layer formed between the nitride semiconductor layer and the electrodes. Accordingly, the nitride semiconductor light emitting element which secures a maximum light emitting area, improves reflectivity of light from the light emitting layer under the electrodes, and is capable of further improving light extraction efficiency to the outside without increasing the size of a chip can be easily obtained.

Further, since the second current diffusing layer is not formed under the first electrode which is formed above the second conductivity type nitride semiconductor layer, reduction in light absorption due to the second current diffusing layer formed on substantially the entire surface above the second conductivity type nitride semiconductor layer of the related art can be realized.

In addition, a multilayer structure such as a DBR structure is not required to be provided under the electrodes, and thus a simple manufacturing process of the related art can be used.

BRIEF DESCRIPTION OF DRAWINGS

FIG. 1B is a top view of the nitride semiconductor light emitting element according to the first embodiment.

FIG. 2 is a sectional view illustrating a connection form of the nitride semiconductor light emitting element according to the first embodiment to the outside.

FIG. 3B is a sectional structure view for describing a process of forming a current non-injection layer according to the first embodiment.

DESCRIPTION OF EMBODIMENTS

Embodiments of the invention will be described hereinafter with reference to drawings; however, specific configurations are not limited to the embodiments, and modification of designs within a range not departing from a scope of the invention, or the like is also included in the invention.

Also, regarding the drawings of the invention according to the embodiments, dimensional relationships such as lengths, widths, and thicknesses are appropriately modified for the sake of clarity and simplification of the drawings, and do not indicate actual dimensional relationships. Hereinafter, a same numeral is given to a same configuration and description thereof will be omitted.

[First Embodiment]

Figure 1A:
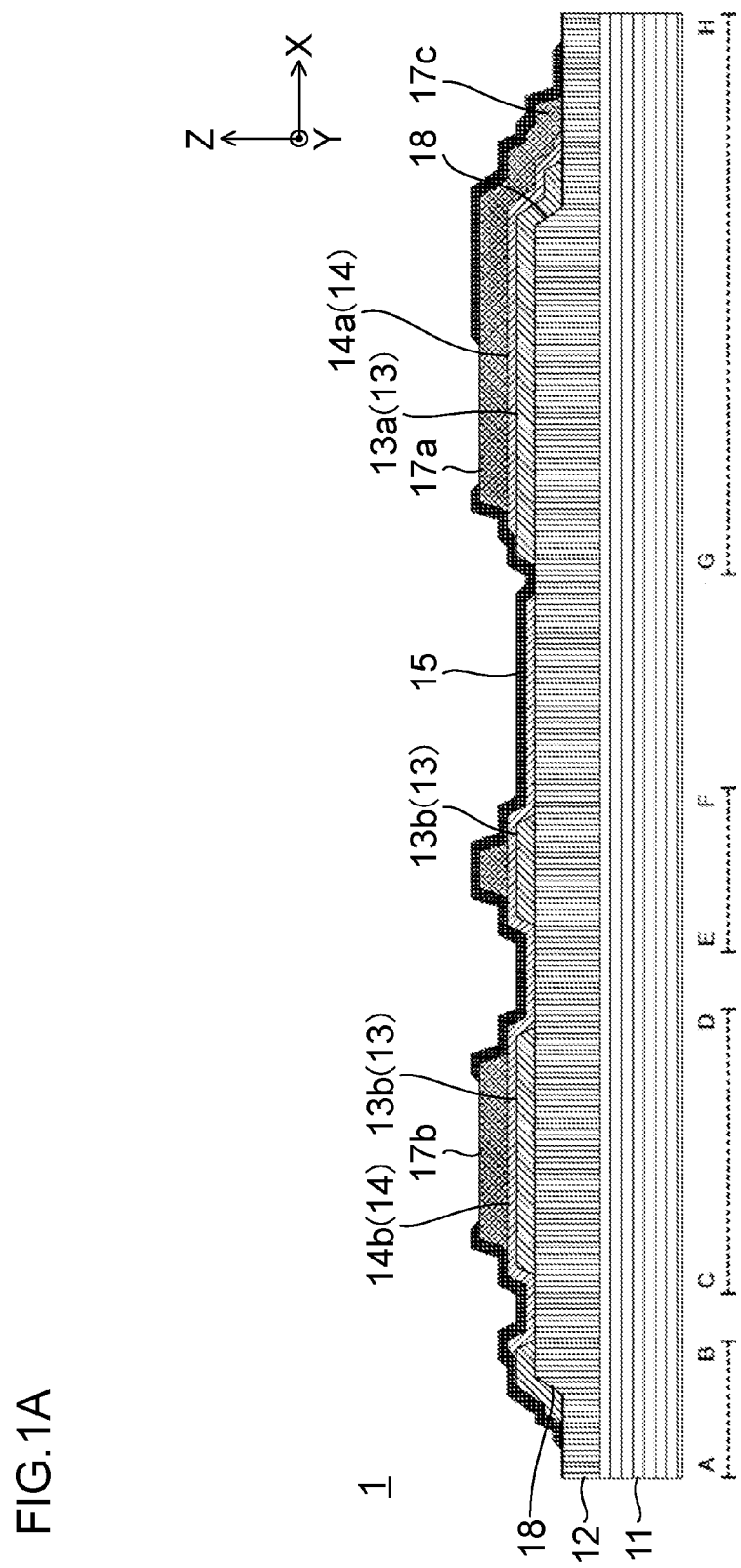
FIG. 1A is a sectional structure view of a nitride semiconductor light emitting element according to a first embodiment.

FIG. 1A is a sectional structure view of a nitride semiconductor light emitting element according to this embodiment. FIG. 1B is a top view of the nitride semiconductor light emitting element according to the embodiment. FIG. 1A illustrates longitudinal sections taken along an A-B line, a C-D line, an E-F line, and a G-H line of FIG. 1B. First, with reference to FIG. 1A and FIG. 1B, a structure of a nitride semiconductor light emitting element 1 according to the embodiment will be described.

As illustrated in FIG. 1A, the nitride semiconductor light emitting element 1 includes a substrate 11, a nitride semiconductor multilayered portion 12, a current non-injection layer 13, a current diffusing layer 14, a protective film 15, an n-side electrode 17a (first electrode), and a p-side electrode 17b (second electrode). The nitride semiconductor multilayered portion 12 is configured with a plurality of epitaxial layers formed by $In_xAl_yGa_{1-x-y}N$ ($0 \le x < 1$ and $0 \le y < 1$). Specifically, the nitride semiconductor multilayered portion 12 is configured with at least a buffer layer, an n-type nitride semiconductor layer, an active layer, and a p-type nitride semiconductor layer.

In the embodiment, the n-type nitride semiconductor layer is an example of a first conductivity type semiconductor layer of the invention, and the p-type nitride semiconductor layer is an example of a second conductivity type semiconductor layer of the invention.

The substrate 11 is, for example, a sapphire substrate, and has a main surface of (0001) plane orientation. A plurality of substrate projection portions (not illustrated) are formed on one main surface of the substrate 11. The substrate projection portion has a substantially truncated cone shape or a substantially conical shape. A height of the substrate projection portion in a direction normal to the main surface of the substrate 11 is, for example, 0.6 μm. Also, in plan view when seen from the normal line direction of the main surface of the substrate 11, a plane shape of the substrate projection portion on the main surface of the substrate 11 is, for example, a circular shape having a diameter of 1 μm. In plan view when seen from the normal line direction of the main surface of the substrate 11, the center of a plane shape of each of the substrate projection portions on the main surface of the substrate 11 is positioned at each vertex of a virtual equilateral triangle, and each of the substrate projection portions are regularly arranged so as to be arranged in a direction of three sides of virtual equilateral triangle. A pitch between the substrate projection portions is, for example, 2 μm. Accordingly, if the plurality of substrate projection portions are formed on the main surface of the substrate 11, when the nitride semiconductor multilayered portion 12 is stacked on the main surface thereof, internal quantum effect and light extraction efficiency of the nitride semiconductor light emitting element 1 can be improved.

The nitride semiconductor multilayered portion 12 is stacked on the main surface of the substrate 11. Specifically, the n-type nitride semiconductor layer is stacked with a buffer layer using AlN formed in between. The n-type nitride semiconductor layer is configured with an underlying layer formed using GaN and a contact layer formed using an n-type GaN doped with Si. A thickness of the underlying layer is, for example, 9 μm, and a thickness of the contact layer is, for example, 2 μm. A carrier concentration of the contact layer is, for example, substantially $6 \times 10^{18}$ cm$^{-3}$. Also, the active layer is stacked on the n-type nitride semiconductor layer. The active layer has a multiple quantum well structure in which a well layer and a barrier layer are alternately repeatedly stacked multiple times. In the embodiment, for example, the well layer is formed using an n-type $In_{0.15}Ga_{0.85}N$, and the thickness thereof is, for example, 3.5 nm. In addition, the barrier layer is formed using Si-doped GaN, and a thickness thereof is, for example, 6 nm. The p-type nitride semiconductor layer is stacked on the active layer.

In addition, a first current non-injection layer 13a and a second current non-injection layer 13b are formed on a part of a region of an upper surface of the p-type nitride semiconductor layer by using a transparent dielectric material such as $SiO_2$ ($n_{Si}$=1.45) (refer to FIG. 1A). Hereinafter, on a upper surface of the p-type nitride semiconductor layer, a region in which the first current non-injection layer 13a is formed is referred to as a first region, and a region in which a second current non-injection layer 13b is formed is referred to as a second region.

In the second region, in plan view when seen from above in a vertical direction (for example, Z direction in FIG. 1A) of a main surface of the nitride semiconductor multilayered portion 12, the p-side electrode 17b and the second current non-injection layer 13b are substantially overlapped with each other. Accordingly, current from the p-side electrode 17b does not flow into the second region right under the p-side electrode 17b where light from the light emitting layer is not transmitted, but flows into a region, other than the second region, which contributes light emission. As a result, light extraction efficiency of the nitride semiconductor light emitting element 1 can be improved.

Since the second current non-injection layer 13b is formed using a material having refractive index lower than that of the p-type nitride semiconductor layer, light emitted from the active layer toward the p-side electrode 17b is likely to be totally reflected at an interface between the p-type nitride semiconductor layer and the second current non-injection layer 13b, before the light being incident on the p-side electrode 17b. For example, when light, which is emitted from the active layer toward the p-side electrode 17b, is incident on the second current non-injection layer 13b from the p-type nitride semiconductor layer, in a case where an incident angle of the light is greater than a critical angle of a total reflection condition at an interface between the p-type nitride semiconductor layer and the second current non-injection layer 13b, the light is totally reflected at the interface between the p-type nitride semiconductor layer and the second current non-injection layer 13b. Accordingly, absorption by the p-side electrode 17b of light emitted from the active layer can be suppressed.

A second current diffusing layer 14b is stacked on the second region of the p-type nitride semiconductor layer including the second current non-injection layer 13b. The second current diffusing layer 14b is, for example, a transparent conductive film formed using indium tin oxide (ITO), and a thickness thereof is, for example, 130 nm. It is preferable that a thickness of the current diffusing layer 14 is set within a range of 100 nm to 340 nm. If the thickness of the current diffusing layer 14 is less than 100 nm, a sheet resistance of the current diffusing layer 14 is increased, and a driving voltage of the nitride semiconductor light emitting element 1 becomes high. Meanwhile, if the thickness of the current diffusing layer 14 is greater than 340 nm, the driving voltage of the nitride semiconductor light emitting element 1 can be reduced, but a degree of absorption by the second current diffusing layer 14b of light emitted from the active layer is increased, and light output of the nitride semiconductor light emitting element 1 is decreased.

In plan view when seen from above in a vertical direction (Z direction) of a main surface of the nitride semiconductor multilayered portion 12, a stepped portion 18 is formed by etching a peripheral portion of the nitride semiconductor multilayered portion 12, and the stepped portion 18 is covered with the current non-injection layer 13 (refer to FIG. 1A and FIG. 1B).

In addition, a depth of the stepped portion 18 reaches the n-type nitride semiconductor layer in the Z direction from an upper surface of the p-type nitride semiconductor layer. In the stepped portion 18, a part from the upper surface to a predetermined depth is removed by etching or the like in the n-type nitride semiconductor layer.

The protective film 15 is formed on the upper surface of the nitride semiconductor multilayered portion 12 and on the stepped portion 18. The protective film 15 is, for example, a transparent dielectric film formed using $SiO_2$ or the like.

In addition, a first opening and a second opening are formed in the protective film 15 by etching. The n-side electrode 17a for being electrically connected to the outside is provided in the first opening, the p-side electrode 17b for being electrically connected to the outside is provided in the second opening, and the electrodes are respectively electrically connected to the outside by bonding wires 19a and 19b or the like (refer to FIG. 2).

In plan view when seen from above in a vertical direction (for example, Z direction in FIG. 1A) of the main surface of the nitride semiconductor multilayered portion 12, the n-side electrode 17a and the first current non-injection layer 13a are overlapped with each other on the first region. In the stepped portion 18 on the first region side, the n-side electrode 17a is formed to extend on the n-type nitride semiconductor layer with the first current non-injection layer 13a in between. The n-side electrode 17a is electrically connected to the n-type nitride semiconductor layer at an extending portion 17c. That is, the n-side electrode 17a is electrically connected to the outside in a first opening, is electrically separated from the second region by the first current non-injection layer 13a, and is formed to extend above the current diffusing layer 14 as well via the stepped portion 18 of the first region side.

Consequently, it is possible to minimize reduction in the light emitting area due to removal of the p-type nitride semiconductor layer by digging in order to form the n-side electrode 17a necessary for connecting to the outside. Accordingly, without increasing a size of chip (particularly, an area of a main surface of the nitride semiconductor light emitting element 1), a maximum light emitting area is secured, and thus the nitride semiconductor light emitting element 1 which is capable of further improving light extraction efficiency can be easily obtained. Further, since a maximum contacting area between the second current diffusing layer 14b and the p-type nitride semiconductor layer can be also secured, reduction in a driving voltage of the nitride semiconductor light emitting element 1 can be realized.

Since the nitride semiconductor multilayered portion 12 and the n-side electrode 17a are electrically separated from each other by the first current non-injection layer 13a, and the second current diffusing layer 14b is not formed on the first region of the p-type nitride semiconductor layer in which the n-side electrode 17a is formed, the n-side electrode 17a is not short-circuited with the active layer, the p-type nitride semiconductor layer, and the second current diffusing layer 14b. In addition, since a refractive index (for example, $n_{si}=1.45$) of the first current non-injection layer 13a is much lower than a refractive index of the p-type nitride semiconductor layer, light emitted from the active layer toward the n-side electrode 17a tends to be totally reflected at the interface between the p-type nitride semiconductor layer and the first current non-injection layer 13a before being incident on the n-side electrode 17a. For example, when the light emitted from the active layer toward the n-side electrode 17a is incident on the first current non-injection layer 13a from the p-type nitride semiconductor layer, in a case where an incident angle of the light is greater than a critical angle of a total reflection condition at the interface between the p-type nitride semiconductor layer and the first current non-injection layer 13a, the light is totally reflected at the interface between the p-type nitride semiconductor layer and the first current non-injection layer 13a. Accordingly, absorption by the n-side electrode 17a of the light emitted from the active layer can be suppressed.

The second current diffusing layer 14b, which has a refractive index greater than that of the first current non-injection layer 13a, is not formed on the first region of the p-type nitride semiconductor layer including the first current non-injection layer 13a, and a configuration in which short-circuiting with the n-side electrode 17a is less likely to be generated is realized.

The first current diffusing layer 14a is formed right under the n-side electrode 17a on the first current non-injection layer 13a. It is desired that the first current diffusing layer 14a and the second current diffusing layer 14b are formed at the same time.

The first current diffusing layer 14a is a transparent conductive film formed using, for example, indium tin oxide (ITO), and having a thickness of, for example, 130 nm. A thickness of the first current diffusing layer 14a is preferably within a range of 100 nm to 340 nm, and if the thickness of the first current diffusing layer 14a is less than 100 nm, a sheet resistance of the first current diffusing layer 14a is increased, and a driving voltage of the nitride semiconductor light emitting element 1 is increased. Meanwhile, if the thickness of the first current diffusing layer 14a is greater than 340 nm, the driving voltage of the nitride semiconductor light emitting element 1 can be reduced, but a degree of absorption by the first current diffusing layer 14a of light emitted from the active layer is increased. Since the first current non-injection layer 13a is formed between the active layer and the first current diffusing layer 14a, light absorption by the first current diffusing layer 14a is reduced.

Each of the n-side electrode 17a and the p-side electrode 17b has a multilayer electrode structure in which a first adhesion layer, a reflective electrode layer, a second adhesion layer, a barrier layer, and a conductive layer are sequentially stacked from the nitride semiconductor multilayered portion 12 side.

The first adhesion layer and the second adhesion layer are formed using, for example, Ni. The reflective electrode layer is formed, for example, using Al, Ag, Rh, or the like, and reflects a part of light emitted from the active layer, which is not reflected but transmitted through the current non-injection layer. Also, the barrier layer is formed using, for example, Pt. Since Pt has a high barrier effect, it possible for the barrier layer to obtain a high barrier effect. The conductive layer is formed using a material such as Au having high electrical conductivity.

In the embodiment, in the stepped portion 18, the active layer which is exposed to the outside by etching or the like is covered with the current non-injection layer 13 in advance, and thus the protective film 15 is not necessarily formed; however, if the protective film 15 is formed of a material having a refractive index between the refractive index of the current non-injection layer 13 or the current diffusing layer 14 and the refractive index of an external environment (mostly covered with a sealing resin or in the atmosphere) of the nitride semiconductor light emitting element 1, there is an effect that light is more likely to be extracted to the outside.

Figure 3A:
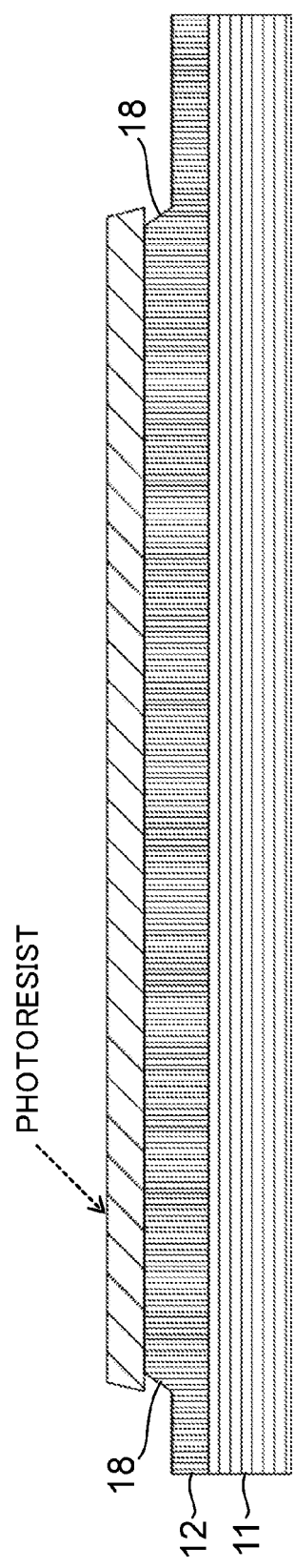
FIG. 3A is a sectional structure view for describing a process of forming a nitride semiconductor multilayered portion according to the first embodiment.
Figure 3C:
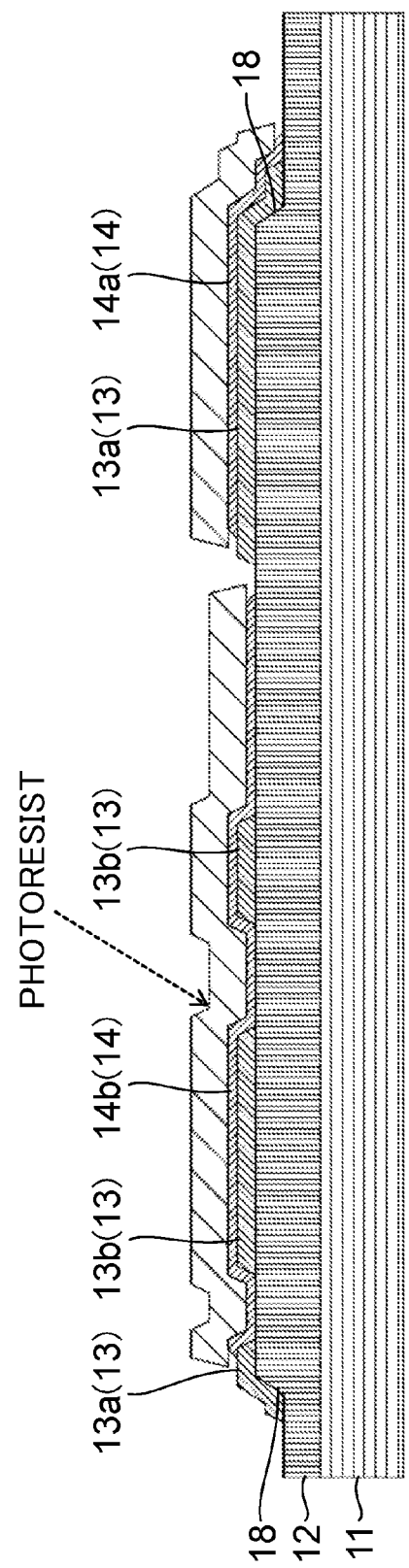
FIG. 3C is a sectional structure view for describing a process of forming a current diffusing layer according to the first embodiment.
Figure 3D:
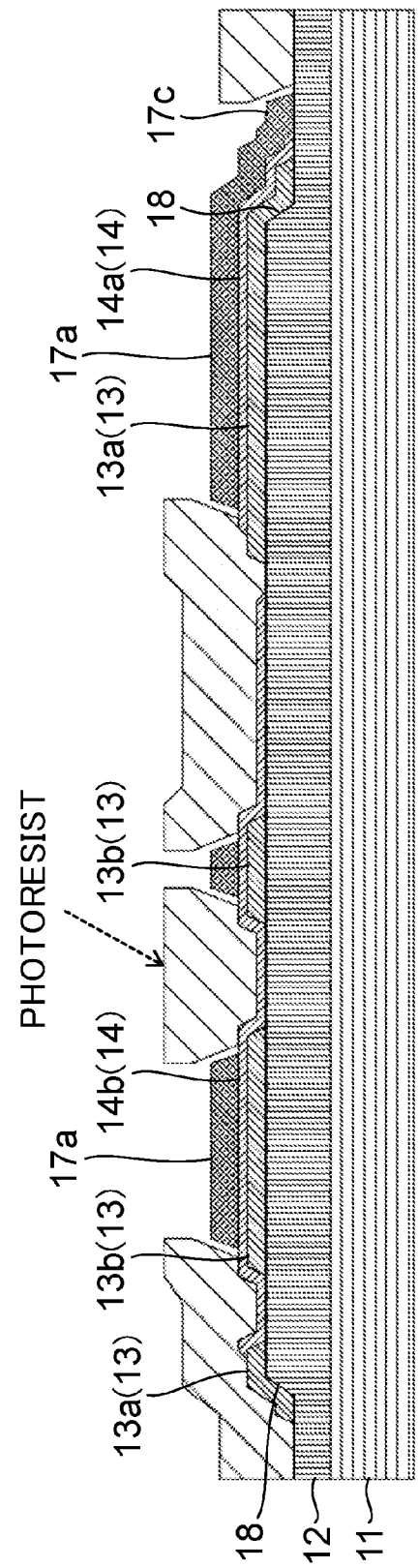
FIG. 3D is a sectional structure view for describing a process of forming an n-side electrode and a p-side electrode according to the first embodiment.
Figure 3E:
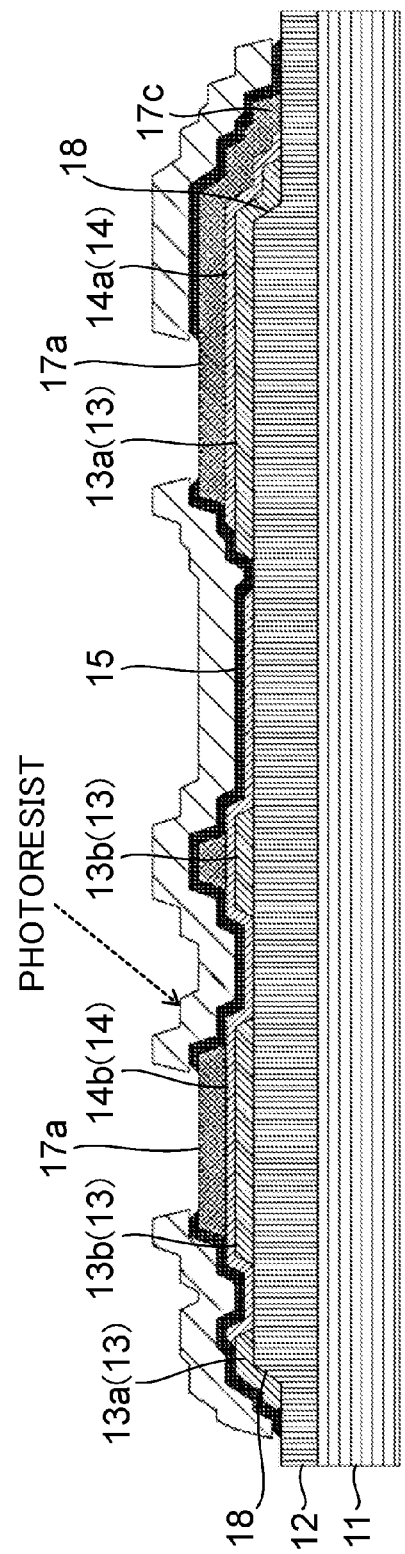
FIG. 3E is a sectional structure view for describing a process of forming a protective film according to the first embodiment.
Figure 3F:
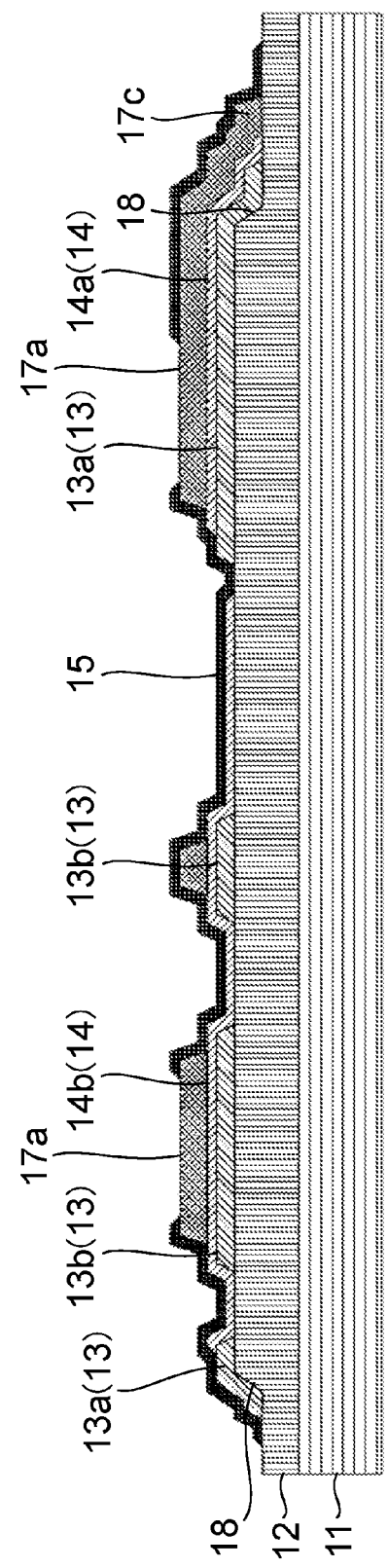
FIG. 3F is a sectional structure view for describing the process of forming the protective film according to the first embodiment.

Next, a method of manufacturing the nitride semiconductor light emitting element 1 according to the first embodiment will be described. FIG. 3A to FIG. 3F are diagrams for describing each process of manufacturing the nitride semiconductor light emitting element 1 according to the first embodiment. FIG. 3A is a sectional structure view for describing a process of forming the nitride semiconductor multilayered portion. FIG. 3B is a sectional structure view for describing a process of stacking the current non-injection layer. FIG. 3C is a sectional structure view for describing a process of forming the current diffusing layer. FIG. 3D is a sectional structure view for describing a process of forming the n-side electrode and the p-side electrode. FIG. 3E and FIG. 3F are sectional structure views for describing a process of forming the protective film.

First, a substrate 11 having a main surface of (0001) plane orientation is prepared. The substrate 11 is formed of, for example, sapphire. A plurality of projection portions (not illustrated) are formed on the main surface of the substrate 11 by photolithography or etching. Such a projection portion is formed by forming a photoresist mask on a surface of a substrate 11 except a part where the projection portion needs to be formed and performing etching of inductively coupled plasma (ICP), or the like using, for example, halogen-based gas such as a mixed gas of $BCl_3$, $Cl_2$, and Ar. Further, a plurality of epitaxial layers configured by $Al_xGa_yIn_{1-x-y}N$ ($0 \leq x < 1$ and $0 \leq y < 1$) are sequentially stacked by, for example, MOCVD on the main surface of the substrate 11 where the plurality of projection portions are formed, and thus the nitride semiconductor multilayered portion 12 is formed.

Specifically, using an organic metal crystal growth method, a molecular beam crystal growth method, or the like, the buffer layer formed of AlN is stacked on the main surface of the substrate 11. After that, under a condition in which a substrate temperature is substantially 1000° C., an underlying layer (not illustrated) formed of GaN and a contact layer formed of Si-doped n-type GaN are sequentially stacked as the n-type nitride semiconductor layer (first conductivity type nitride semiconductor layer). A thickness of the underlying layer is, for example, 9 μm, and a thickness of the contact layer is, for example, 2 μm. In addition, a carrier concentration of the contact layer is, for example, substantially $6 \times 10^{18}$ cm$^{-3}$. Also, under a condition in which the substrate temperature is substantially 890° C., a well layer formed of $In_{0.15}Ga_{0.85}N$ and a barrier layer formed of Si-doped GaN are alternatively stacked on the n-type nitride semiconductor layer six times, and the active layer is stacked. The p-type nitride semiconductor layer (second conductivity type nitride semiconductor layer) is formed on the active layer.

Next, using photolithography or the like, a region of the nitride semiconductor multilayered portion 12 is partially removed by etching. Specifically, in plan view when seen from above in a vertical direction (Z direction) of the main surface of the nitride semiconductor multilayered portion 12, a part of the p-type nitride semiconductor layer, and a peripheral vicinity region along the entirety of the peripheral portion of the active layer and the p-type nitride semiconductor layer are removed by etching until the n-type nitride semiconductor layer is exposed, and the stepped portion 18 is formed. The etching process is performed until a depth of etching reaches a predetermined depth from the upper surface of the n-type nitride semiconductor layer. Accordingly, in plan view when seen from above in a vertical direction (Z direction) of the main surface of the nitride semiconductor multilayered portion 12, the n-type nitride semiconductor layer is in a state of being exposed in the stepped portion 18.

Next, as illustrated in FIG. 3B, the current non-injection layer 13 is stacked on the nitride semiconductor multilayered portion 12. The current non-injection layer 13 is formed using a transparent dielectric material such as $SiO_2$ having a relatively low refractive index.

After stacking the current non-injection layer 13, using a photolithography method, the first current non-injection layer 13a and the second current non-injection layer 13b are separately formed by removing, with etching, the current non-injection layer which is provided on a region other than a region where the n-side electrode and the p-side electrode are formed on the nitride semiconductor multilayered portion 12.

Next, as illustrated in FIG. 3C, the current diffusing layer 14, which is formed using, for example, indium tin oxide (ITO), is stacked on the current non-injection layer 13 and the nitride semiconductor multilayered portion 12 by sputtering. The thickness of the current diffusing layer 14 is, for example, 130 nm. The thickness of the current diffusing layer 14 may be within a range of 100 nm to 340 nm. In addition, a sheet resistance of the current diffusing layer 14 measured at this time is substantially 200Ω/□(Ω/sq).

After forming the current diffusing layer 14, under a condition that the substrate temperature is 600° C. in a mixed gas atmosphere of oxygen 2% and nitrogen 98%, a first annealing process is performed for ten minutes. After performing the first annealing process, transmissivity of the current diffusing layer 14 is measured, and transmissivity with respect to light having a wavelength of 450 nm is increased to be 94% or more.

After finishing the first annealing process, the current diffusing layer 14 is once exposed in the atmosphere, is returned to a furnace again, and then a second annealing process is performed for five minutes under a condition that the substrate temperature is 500° C. in the vacuum atmosphere. After performing the second annealing process, a sheet resistance of the current diffusing layer 14 is measured, and the resistance is decreased to 11 Ω/□ (Ω/sq). Accordingly, when the second annealing process is performed, a sheet resistance of an ITO transparent conductive film formed as the current diffusing layer 14 can be decreased.

Next, using photolithography, the first current diffusing layer 14a and the second current diffusing layer 14b are separately formed by removing the peripheral portion of the nitride semiconductor multilayered portion 12 and regions other than a second region on the main surface of the nitride semiconductor multilayered portion 12 and the current diffusing layer 14 formed on the first current non-injection layer 13a, with etching.

Next, as illustrated in FIG. 3D, using electron beam deposition and lift-off technology, in the first region, the n-side electrode 17a is formed on the first current diffusing layer 14a on the first current non-injection layer 13a, and the extending portion 17c of the n-side electrode 17a is formed on the exposed surface of the n-type nitride semiconductor layer. Moreover, those electrode portions are conducted to the n-side electrode 17a formed on the first current non-injection layer 13a formed on the stepped portion 18 in the first region. Simultaneously, the p-side electrode 17b is formed on the second current diffusing layer 14b formed on the second current non-injection layer 13b.

Specifically, for example, using photolithography, after forming a photoresist on the entire surface of the main surface of the nitride semiconductor multilayered portion 12, a photoresist pattern is formed by removing only the photoresist formed on a region where an electrode is formed.

The first adhesion layer, the reflective electrode layer, the second adhesion layer, the barrier layer, and the conductive layer are sequentially stacked on the entire surface of the main surface of the nitride semiconductor multilayered portion 12 by electron beam deposition. After that, the first adhesion layer, the reflective electrode layer, the second adhesion layer, the barrier layer, and the conductive layer, which are formed on the photoresist, are removed together with the photoresist pattern by the lift-off process.

As described above, the n-side electrode 17a and the p-side electrode 17b, which are configured with the first adhesion layer, the reflective electrode layer, the second adhesion layer, the barrier layer, and the conductive layer, are formed at the same time.

Next, as illustrated in FIG. 3E, by plasma CVD, sputtering, or the like, for example, in a mixed gas atmosphere constituted by $SiH_4$ and oxygen, for example, the protective film 15 formed of $SiO_2$ is formed. Specifically, in plan view when seen from above in a vertical direction of the main surface of the nitride semiconductor multilayered portion 12, the protective film 15 is formed on the current diffusing layer except a region where the n-side electrode 17a and the p-side electrode 17b are formed, and on a upper surface of the n-side electrode 17a and the p-side electrode 17b and a side surface having the stepped portion 18. In addition, at this time, by adjusting flow rate of $SiH_4$ gas, flow rate of oxygen gas, or the like, the protective film 15 is formed so that the refractive index $n_{15}$ of the protective film 15 is smaller than the refractive index $n_{13}$ of the current non-injection layer and the refractive index $n_{14}$ of the current diffusing layer ($n_{15}<n_{13}$ and $n_{15}<n_{14}$). The relationship between the refractive index $n_{13}$ of the current non-injection layer and the refractive index $n_{14}$ of the current diffusing layer is expressed as $n_{13}<n_{14}$, and thus the ratio of total reflection under any of the n-side electrode 17a and the p-side electrode 17b is increased.

After forming the protective film 15, an opening is formed on an upper surface of the n-side electrode 17a and the p-side electrode 17b using photolithography.

Hitherto, as illustrated in FIG. 3F, the nitride semiconductor light emitting element 1 according to the embodiment can be obtained.

Table 1 shows reflectivity of light from the light emitting layer under an n-electrode manufactured by the first embodiment of the invention as Example, and reflectivity in a case of a configuration of a light emitting element described in PTL 2 as a comparative example.

TABLE 1

| | Average Reflectivity (%) |
|---|---|
| Example | 95.6 |
| Comparative Example | 92.8 |

As indicated in the Table 1, light absorption under an electrode can be reduced by providing the current diffusing layer on the current non-injection layer between a nitride semiconductor layer and an electrode.

[Second Embodiment]

Figure 4:
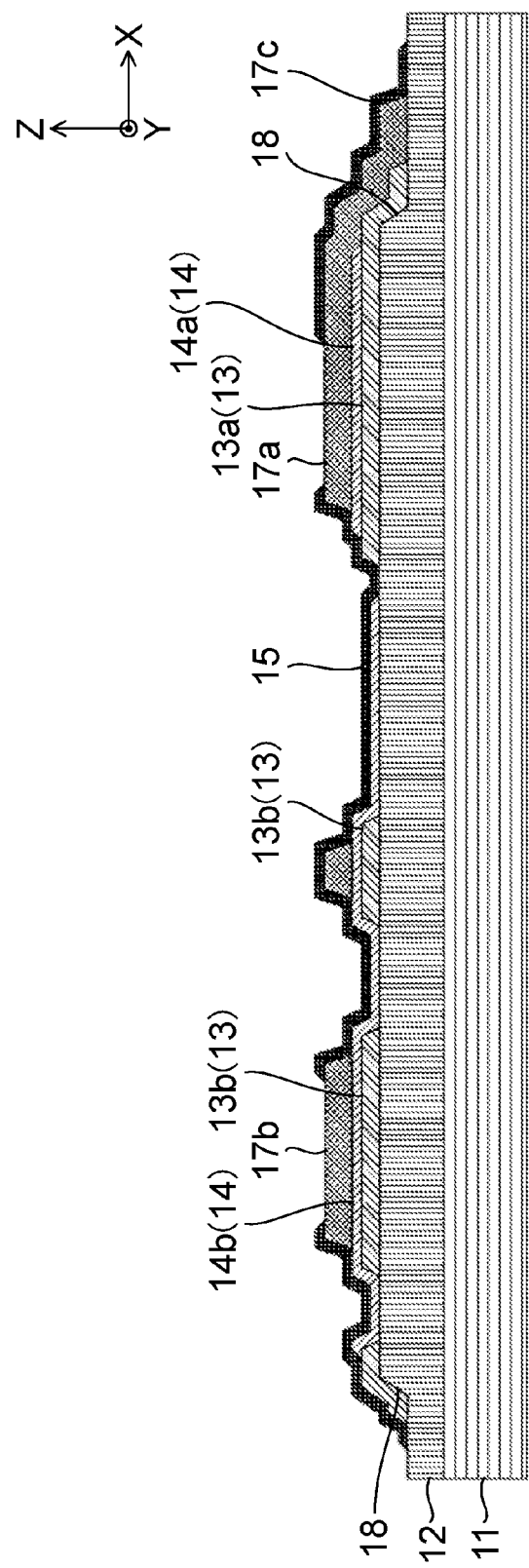
FIG. 4 is a sectional structure view of a nitride semiconductor light emitting element according to a second embodiment.
Figure 5:
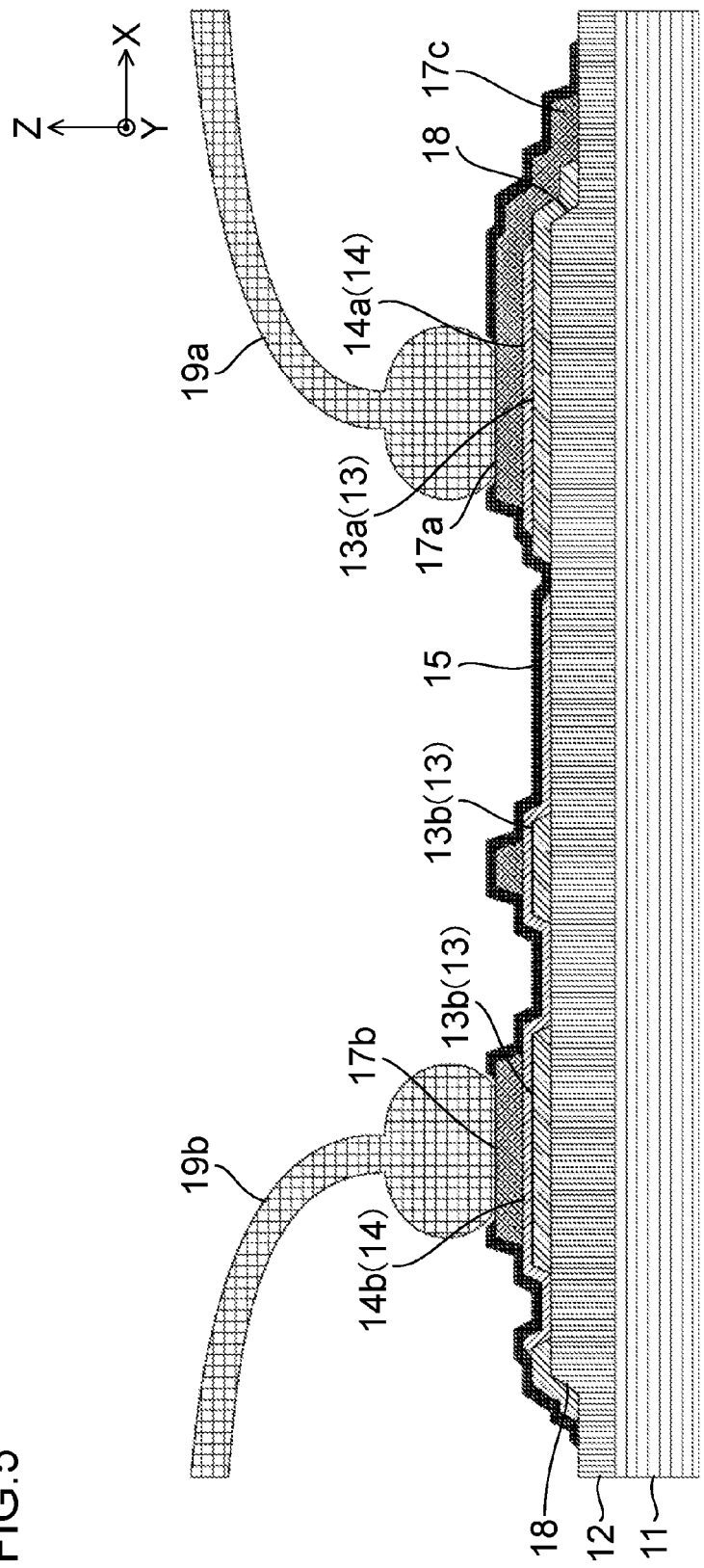
FIG. 5 is a sectional view illustrating a connection form of the nitride semiconductor light emitting element according to the second embodiment to the outside.

FIG. 4 is a sectional structure view of a nitride semiconductor light emitting element according to a second embodiment, and FIG. 5 is a sectional view illustrating a connection form of the nitride semiconductor light emitting element according to the second embodiment to the outside.

In the first embodiment, in an n-side electrode region, a part of the current diffusing layer 14 is formed from an upper side of the current non-injection layer 13 via a stepped portion 18 to an n-type nitride semiconductor exposed surface, but the embodiment differs in that the current diffusing layer 14 is formed on only the current non-injection layer 13 on the nitride semiconductor multilayered portion 12.

[Third Embodiment]

Figure 6:
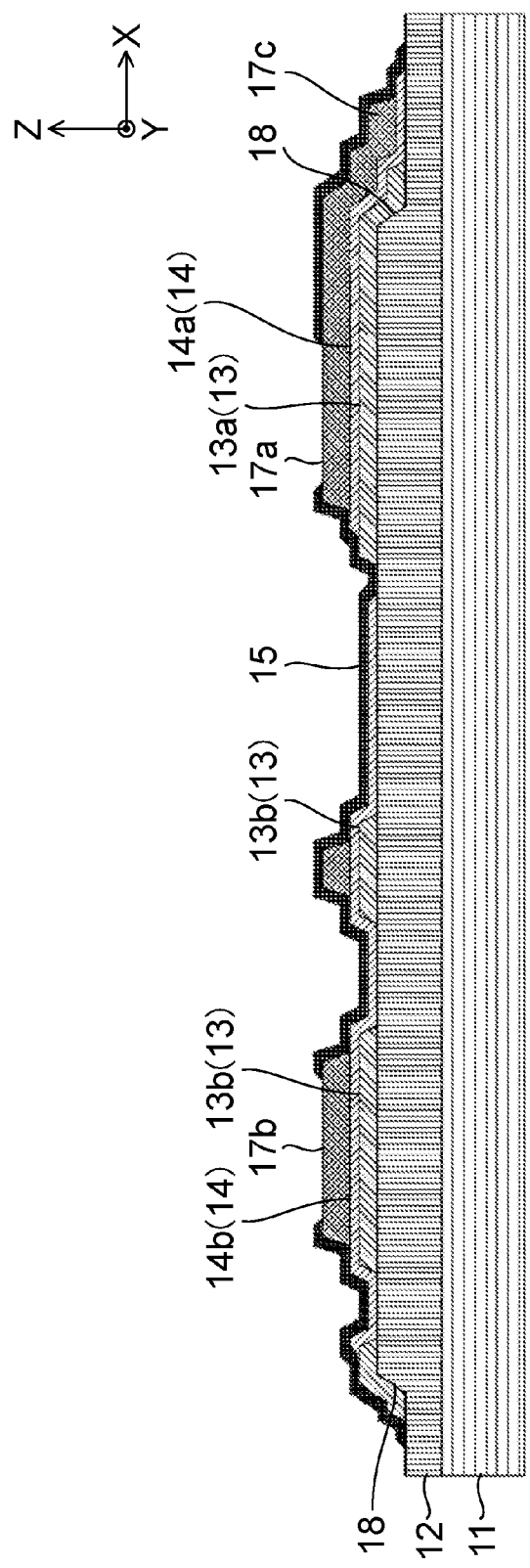
FIG. 6 is a top structure view of a nitride semiconductor light emitting element according to a third embodiment.
Figure 7:
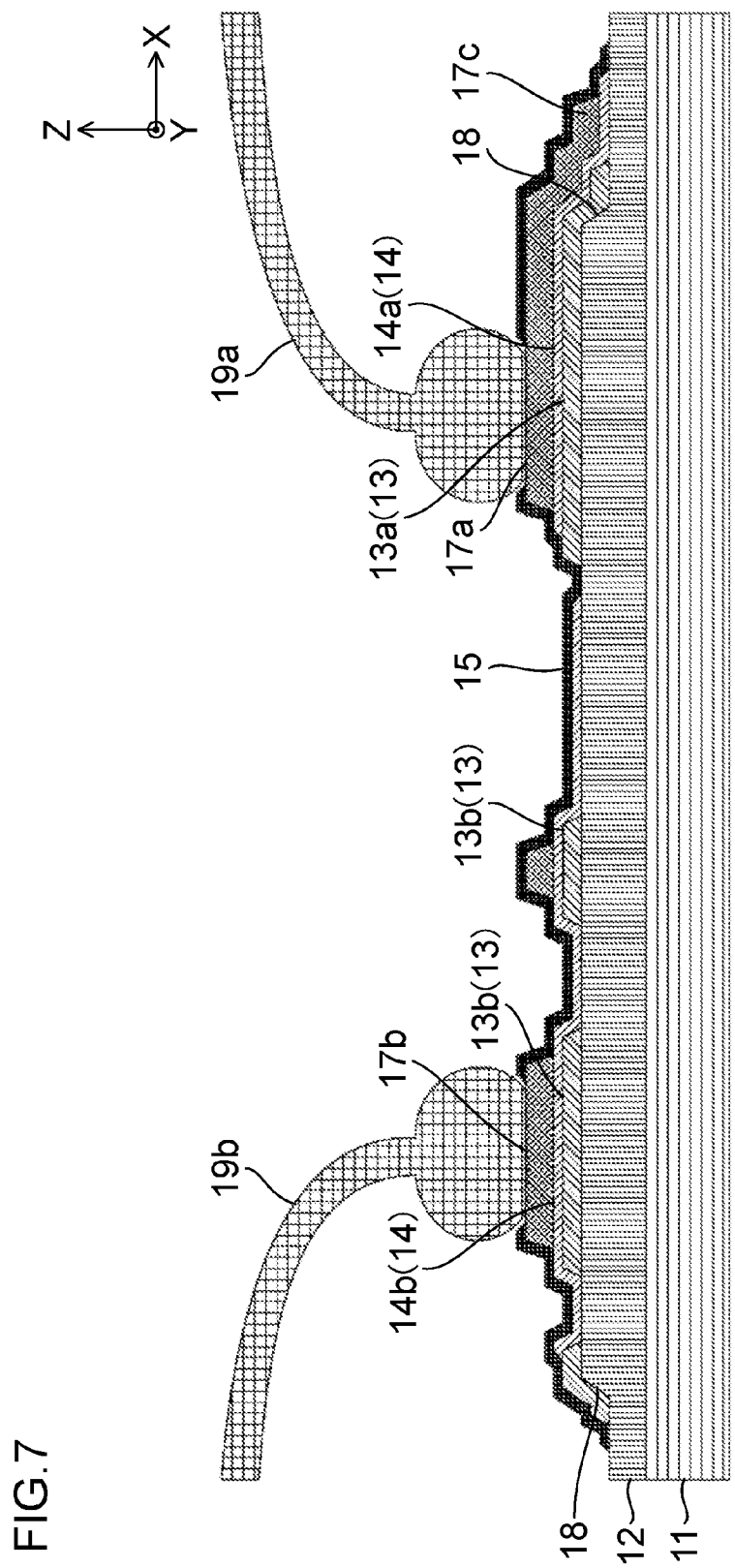
FIG. 7 is a sectional view illustrating a connection form of the nitride semiconductor light emitting element according to the third embodiment to the outside.

FIG. 6 is a sectional structure view of a nitride semiconductor light emitting element according to a third embodiment, and FIG. 7 is a sectional view illustrating a connection form of the nitride semiconductor light emitting element according to the third embodiment to the outside.

The embodiment differs in that the current diffusing layer 14 is formed on the entire surface of an n-side electrode forming portion.

[Fourth Embodiment]

Figure 8:
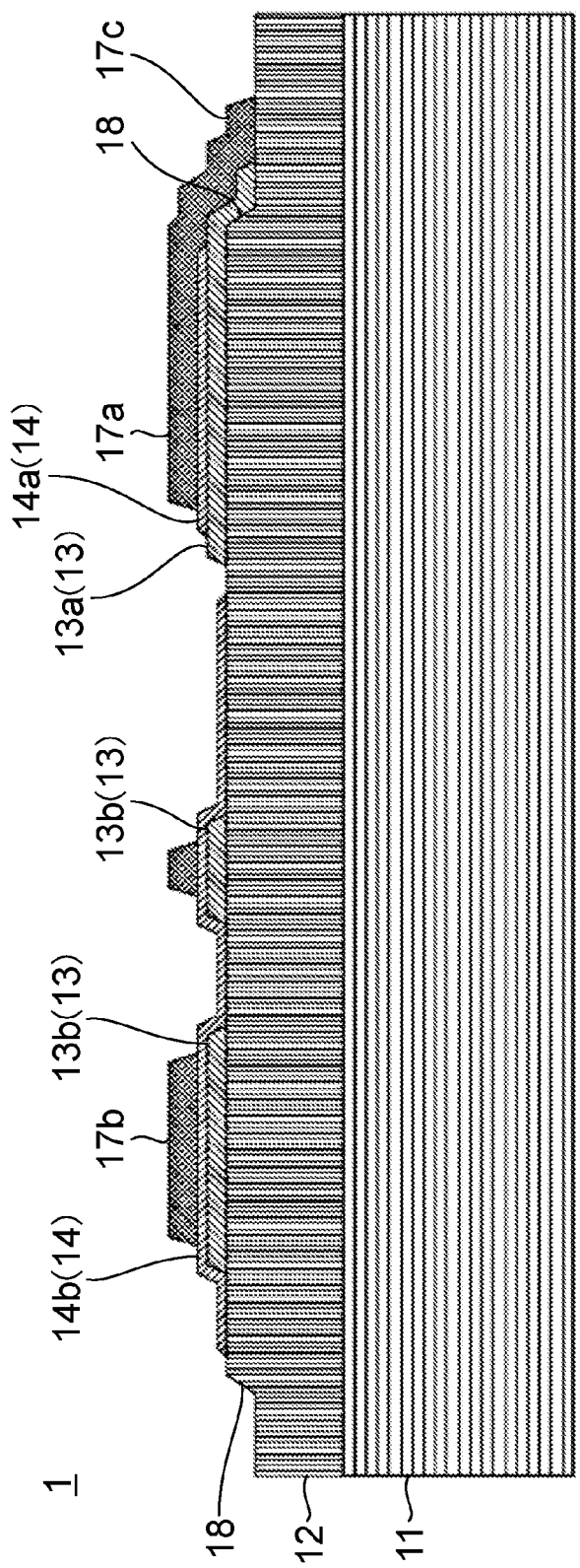
FIG. 8 is a sectional structure view of a nitride semiconductor light emitting element according to a fourth embodiment.
Figure 9:
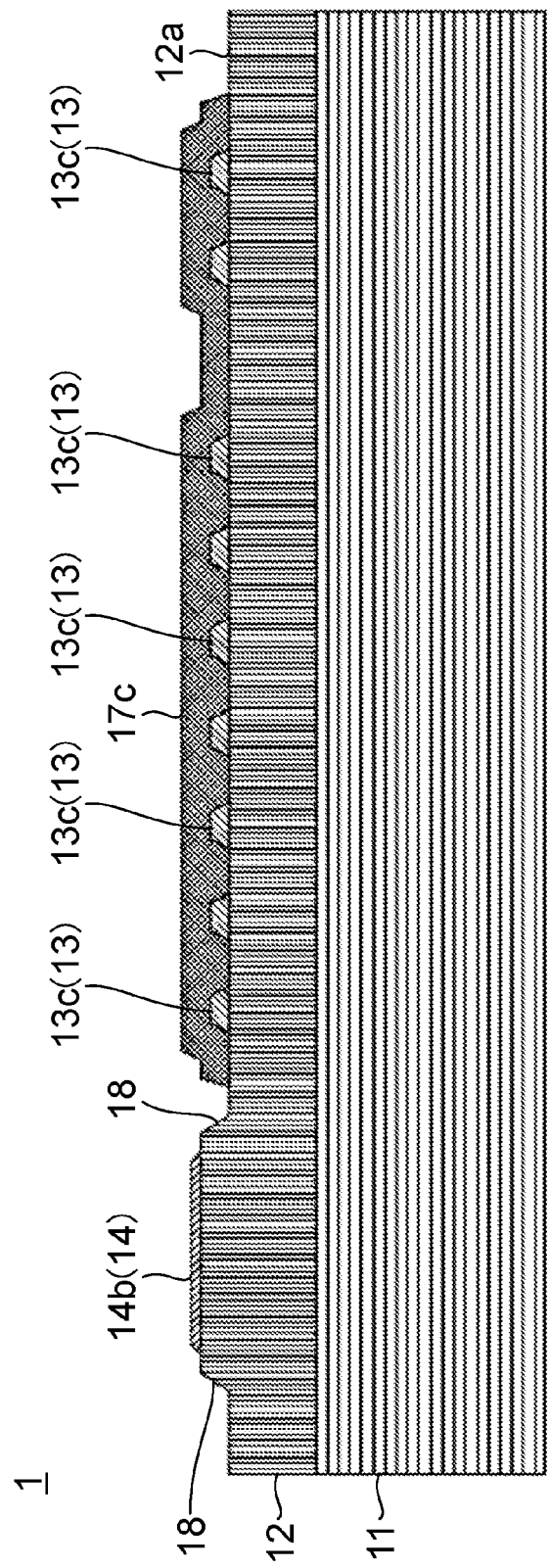
FIG. 9 is a sectional structure view of the nitride semiconductor light emitting element according to the fourth embodiment.
Figure 10:
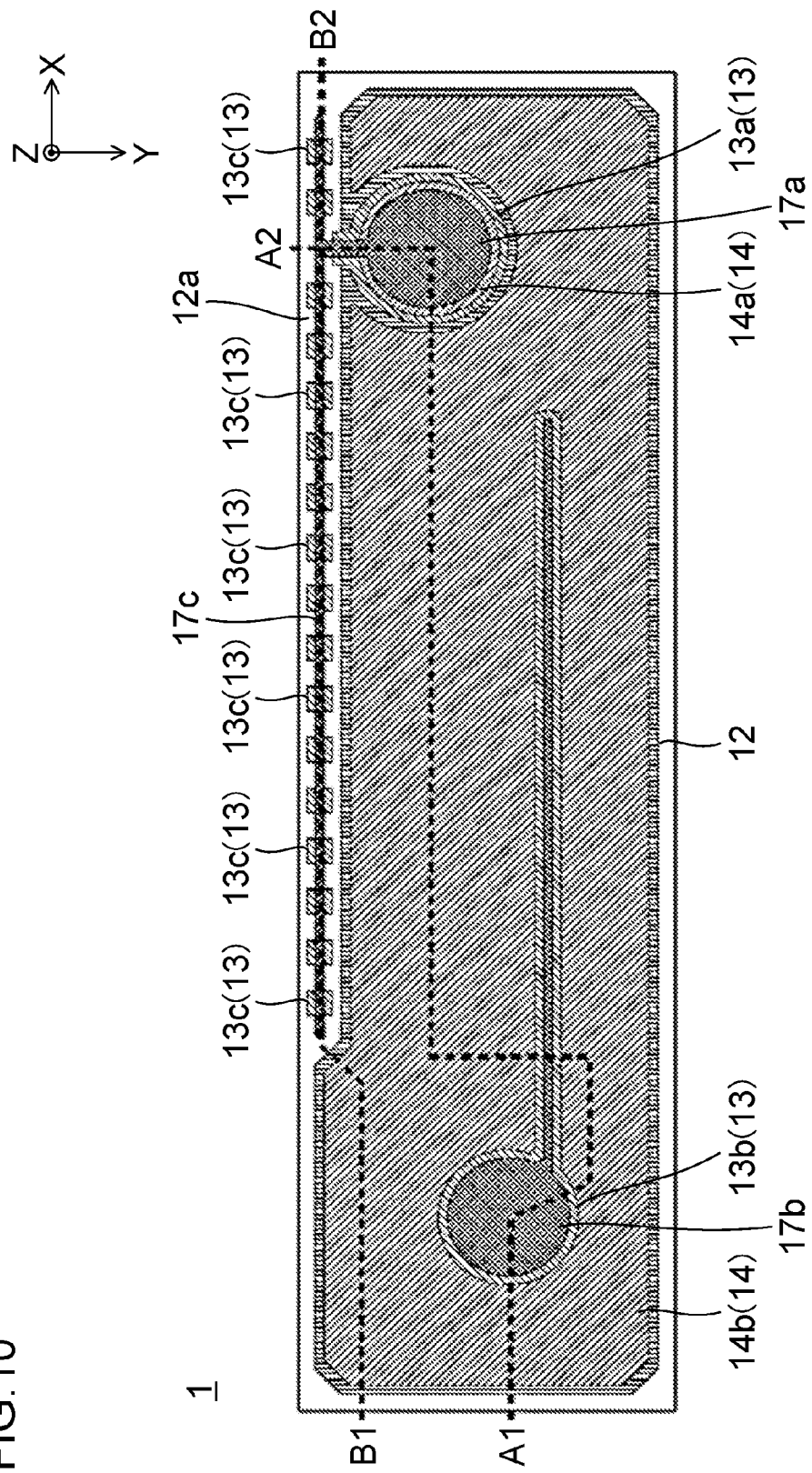
FIG. 10 is a top view of the nitride semiconductor light emitting element according to the fourth embodiment.

FIG. 8 and FIG. 9 are sectional structure views of a nitride semiconductor light emitting element according to a fourth embodiment, and FIG. 10 is a top view of the nitride semiconductor light emitting element according to the fourth embodiment. FIG. 8 illustrates a sectional view taken along a line A1-A2 of FIG. 10, and FIG. 9 illustrates a sectional view taken along a line B1-B2 of FIG. 10.

In the fourth embodiment, after stacking the current non-injection layer 13, using photolithography, the current non-injection layer, which is provided on a region other than the n-side electrode region and a region other than a p-side electrode forming region on the nitride semiconductor multilayered portion 12, is removed by etching. Accordingly, as illustrated in FIG. 8 to FIG. 10, the first current non-injection layer 13a, the second current non-injection layer 13b, and the first current non-injection layer 13c, which is formed on a region of an exposed portion 12a on the n-type nitride semiconductor layer, are separately formed at the same time.

The first current non-injection layers 13c are formed to be scattered with a predetermined gap therebetween along an X direction in FIG. 10. Each of the plurality of first current non-injection layers 13c has a rectangular shape when seen from the Z direction of FIG. 10, and has a trapezoidal shape when seen from a Y direction in FIG. 10 (refer to FIG. 9). The extending portion 17c of the n-side electrode 17a is formed in an extending band shape, which becomes a straight line along the X direction, over the plurality of first current non-injection layers 13c, which are scattered, on an upper side of the first current non-injection layer 13c. The extending portion 17c of the n-side electrode 17a is in contact with the n-type nitride semiconductor layer so as to be conducted thereto in a position between the plurality of first current non-injection layers 13c, which are scattered, and on both end portions in the X direction.

The embodiment is different from the first embodiment to the third embodiment in that the first current non-injection layer 13c is formed on a region under the extending portion 17c of the n-side electrode 17a.

For example, in a case where the first current non-injection layer is not formed under the extending portion 17c of the n-side electrode 17a, the reflectivity of light from the light emitting layer becomes 80.1%. On the other hand, if the first current non-injection layer 13c is partially formed under the extending portion 17c of the n-side electrode 17a, the reflectivity of light from the light emitting layer becomes 93.8%, and the reflectivity is improved. Numeral values of reflectivity are results obtained from a simulation, and the same is applied to embodiments hereinafter.

The plurality of first current non-injection layers 13c are formed in an array under the extending portion 17c of the n-side electrode 17a, and therefore light output can be improved without changing an applying voltage value. The light output can be adjusted by changing a width (W) and a pitch (P) in the X direction in FIG. 10 of each of the plurality of first current non-injection layers 13c under the extending portion 17c of the n-side electrode 17a. A maximum light output can be obtained at the time when a relationship of W/P becomes W/P≅0.5 is satisfied.

Most of the effect of improving the light output of the embodiment can be defined by a light reflecting effect at the interface between the nitride semiconductor multilayered portion 12 and the first current non-injection layer 13c. In the embodiment, in order to efficiently extract light entering the inside of the first current non-injection layer 13c to the nitride semiconductor multilayered portion 12 side again, a sectional shape when seen from the Y direction in FIG. 10 of the first current non-injection layers 13c is configured to be a trapezoidal shape (refer to FIG. 9). However, the shape of the first current non-injection layer 13c is not limited thereto, and may be a shape in which an upper surface has a curved surface such as hemispherical in FIG. 9, or may be a triangular pyramidal.

Accordingly, when a coverage ratio is increased by the first current non-injection layer 13c under the extending portion 17c of the n-side electrode 17a, an area in which relatively high reflectivity is obtained is increased, and light extraction efficiency of the nitride semiconductor light emitting element 1 is improved.

Here, a detailed configuration of the current non-injection layer 13 of the nitride semiconductor light emitting element 1 according to the embodiments of the invention will be described with reference to FIG. 11 to FIG. 13.

Figure 11:
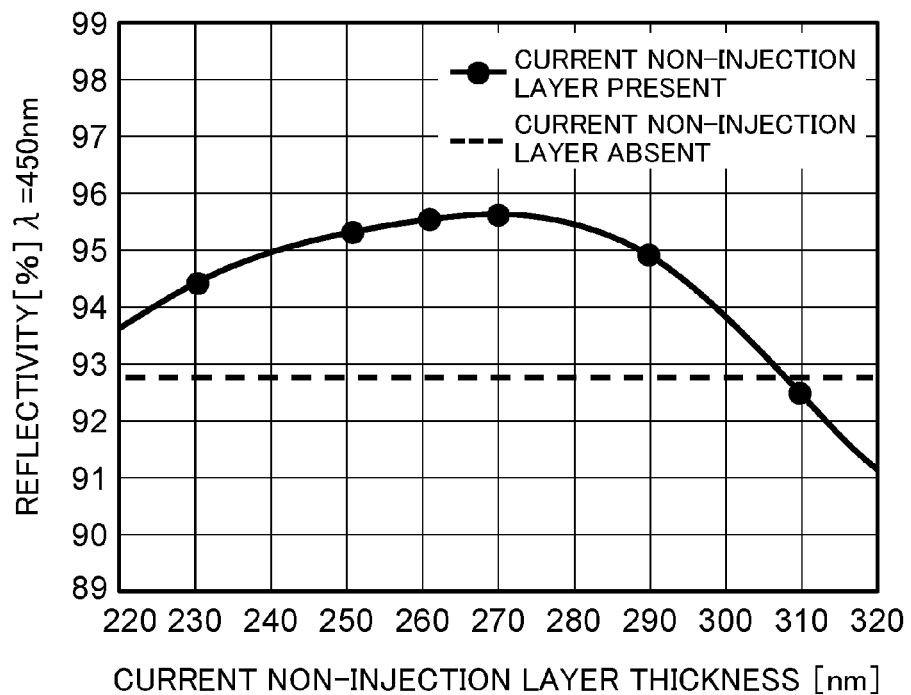
FIG. 11 is a graph indicating an influence of a thickness of the current non-injection layer of the nitride semiconductor light emitting element according to the embodiment of the invention on reflectivity of light from a light emitting layer under an n electrode.

FIG. 11 is a graph indicating an influence of the thickness of the current non-injection layer 13 on reflectivity of light from a light emitting layer under an n electrode. In the drawing, reflectivity of light in a case where the current non-injection layer is absent is illustrated by a broken line, and reflectivity of light in a case where the current non-injection layer is present is illustrated by a solid line. According to FIG. 11, compared to a case in which the current non-injection layer is absent, it is found that reflectivity of light in a range in which the thickness of the current non-injection layer 13 is at least 230 nm to 290 nm is improved. Particularly, reflectivity of light reaches a maximum value in a case where the thickness of the current non-injection layer 13 is substantially 270 nm.

Figure 12:
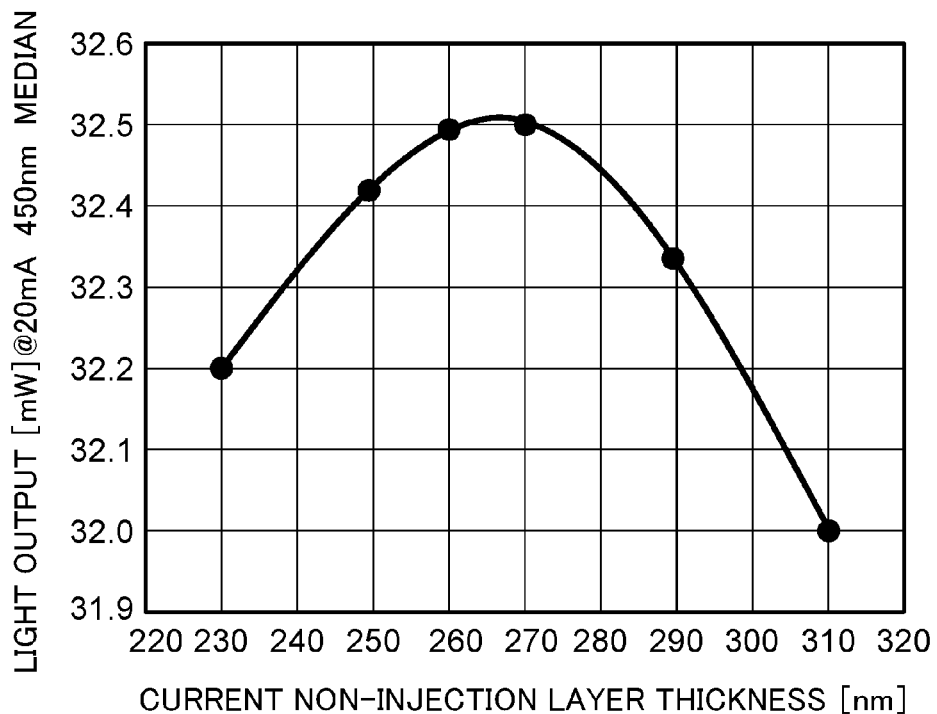
FIG. 12 is a graph indicating an influence of a thickness of the current non-injection layer of the nitride semiconductor light emitting element according to the embodiment of the invention on light output.

FIG. 12 is a graph indicating an influence of the thickness of the current non-injection layer 13 on light output. According to FIG. 12, it is found that the light output reaches a maximum value in a case where the thickness of the current non-injection layer 13 is substantially 270 nm.

Figure 13:
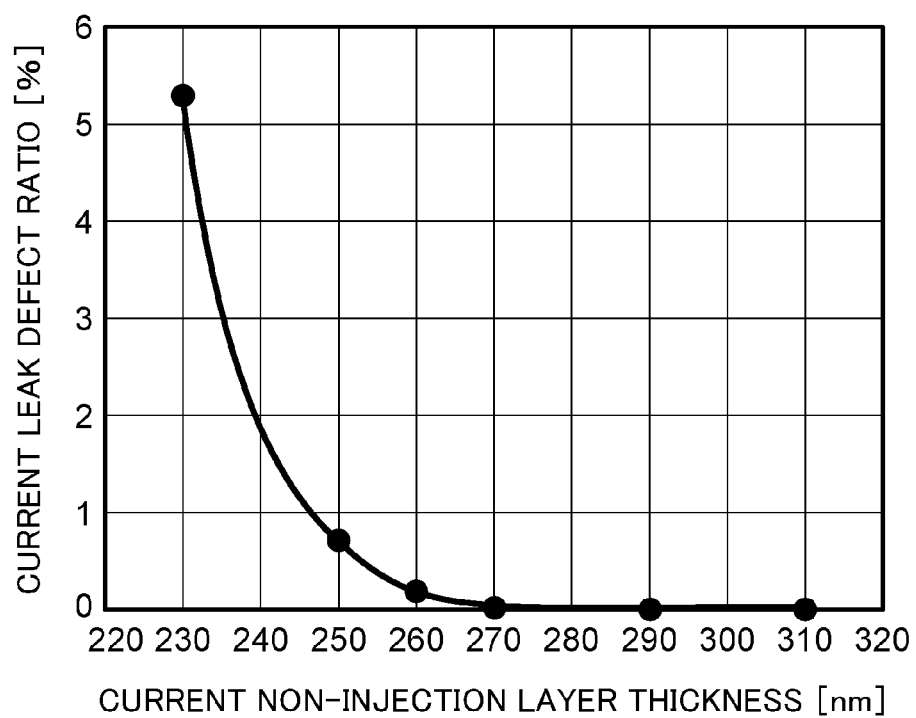
FIG. 13 is a graph indicating an influence of a thickness of the current non-injection layer of the nitride semiconductor light emitting element according to the embodiment of the invention on a current leak defect ratio.

FIG. 13 is a graph indicating an influence of the thickness of the current non-injection layer 13 on a current leak defect rate. According to FIG. 13, it is found that the current leak defect ratio is decreased as the thickness of the current non-injection layer 13 is increased. If the thickness of the current non-injection layer 13 is substantially 270 nm, the current leak defect ratio becomes almost 0%.

Under consideration of such FIG. 11, FIG. 12, and FIG. 13, regarding optimization of the reflectivity of light from the light emitting layer, the thickness of the current non-injection layer 13 is preferably in a range of 230 nm to 290 nm, and regarding the light output and the current leak defect ratio, the thickness of the current non-injection layer 13 is preferably in a range of 250 nm to 290 nm. More preferably, the thickness of the current non-injection layer 13 may be substantially 270 nm.

[Fifth Embodiment]

Figure 14:
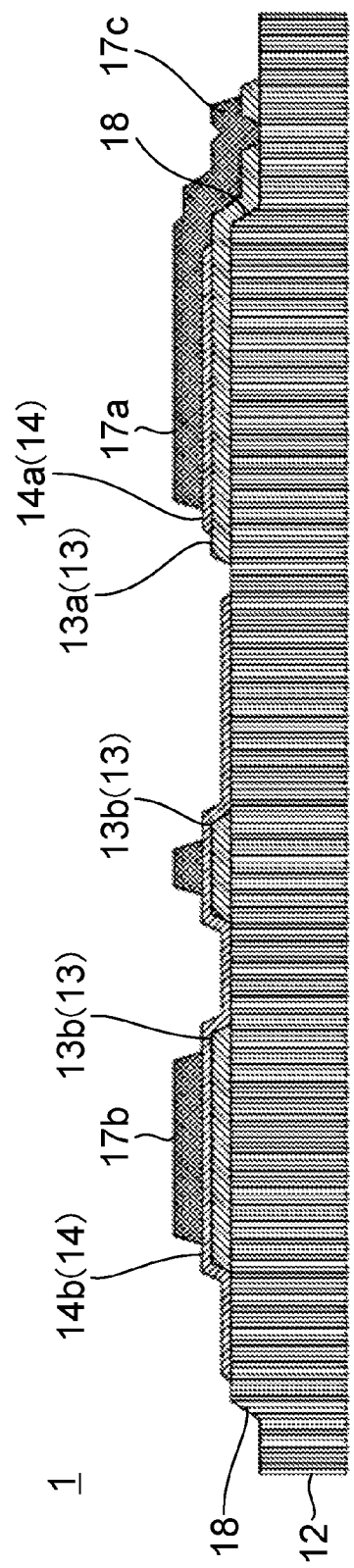
FIG. 14 is a sectional structure view of a nitride semiconductor light emitting element according to a fifth embodiment.
Figure 15:
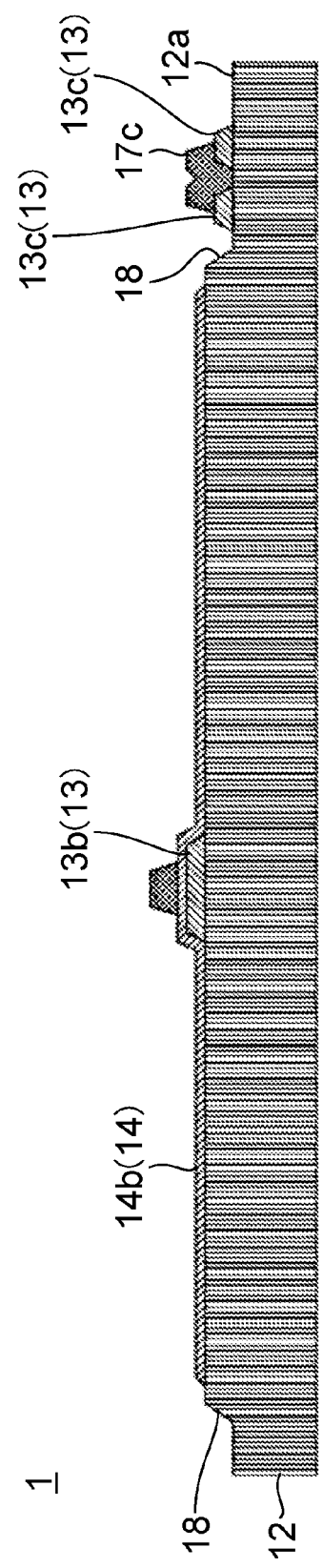
FIG. 15 is a sectional structure view of the nitride semiconductor light emitting element according to the fifth embodiment.
Figure 16:
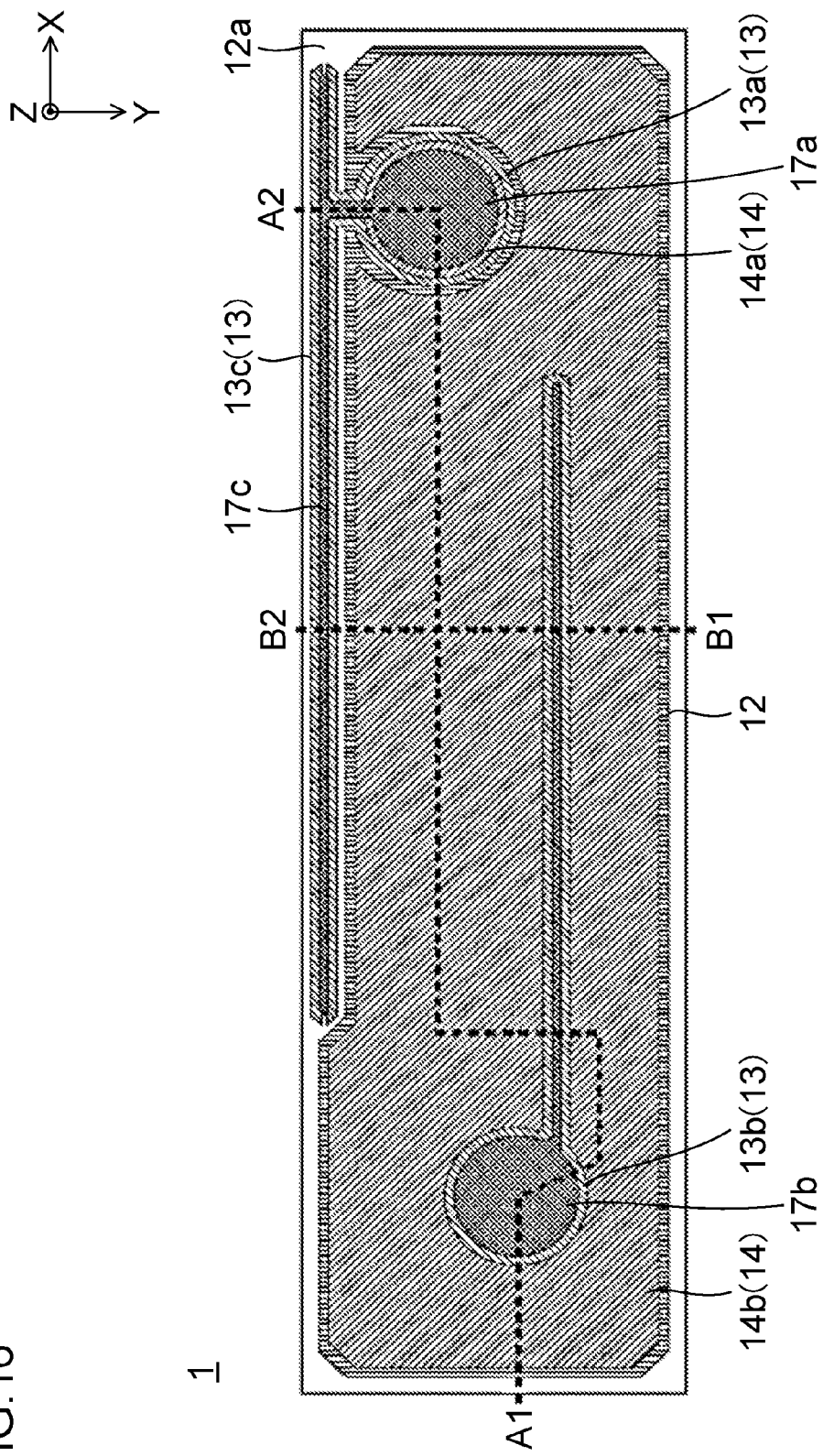
FIG. 16 is a top view of the nitride semiconductor light emitting element according to the fifth embodiment.

FIG. 14 and FIG. 15 are sectional structure views of a nitride semiconductor light emitting element according to a fifth embodiment, and FIG. 16 is a top view of the nitride semiconductor light emitting element according to the fifth embodiment. FIG. 14 illustrates a sectional view taken along an A1-A2 line of FIG. 16, and FIG. 15 illustrates a sectional view taken along a B1-B2 line of FIG. 16. In FIG. 14 and FIG. 15, illustration of the substrate 11 is omitted.

In the fifth embodiment, after stacking the current non-injection layer 13, using photolithography, the current non-injection layer, which is provided on a region other than the n-side electrode region and a region other than a region where the p-side electrode is formed, on the nitride semiconductor multilayered portion 12, is removed by etching. Accordingly, as illustrated in FIG. 14 to FIG. 16, the first current non-injection layer 13a, the second current non-injection layer 13b, the first current non-injection layer 13c formed on a region of the exposed portion 12a on the n-type nitride semiconductor layer are separately formed at the same time.

The first current non-injection layer 13c is formed in an extending band shape which becomes a straight line along the X direction in FIG. 16. Also, the first current non-injection layer 13c has an area when seen from the Z direction in FIG. 16 wider than an area of the extending portion 17c of the n-side electrode 17a. In the first current non-injection layer 13c, a center portion in the Y direction in FIG. 16 is removed in a straight line shape along the X direction. The extending portion 17c of the n-side electrode 17a is formed on the first current non-injection layer 13c so as to be over the removed center portion in the Y direction, and extends in a band shape which becomes a straight line along the X direction similarly to the first current non-injection layer 13c. The extending portion 17c of the n-side electrode 17a comes into contact with and conducted to the n-type nitride semiconductor layer in a position in which the center portion in the Y direction of the first current non-injection layer 13c is removed.

The embodiment is different from the first embodiment to the third embodiment in that the first current non-injection layer 13c is formed on a region under the extending portion 17c of the n-side electrode 17a.

In the embodiment also, in the same manner as that of the fourth embodiment, compared to a case in which the first current non-injection layer is not formed under the extending portion 17c of the n-side electrode 17a, the reflectivity of light from the light emitting layer is improved, and light extraction efficiency of the nitride semiconductor light emitting element 1 is improved.

[Sixth Embodiment]

Figure 17:
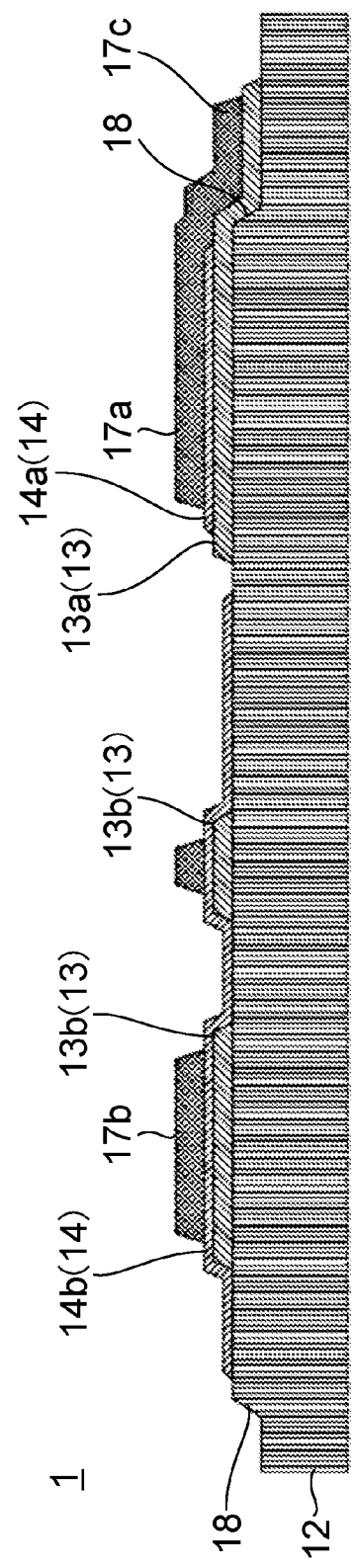
FIG. 17 is a sectional structure view of a nitride semiconductor light emitting element according to a sixth embodiment.
Figure 18:
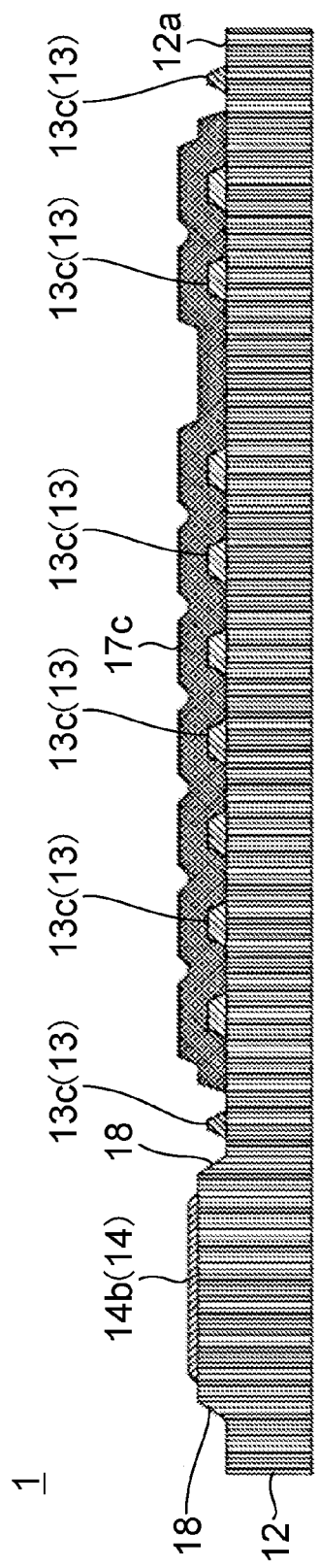
FIG. 18 is a sectional structure view of the nitride semiconductor light emitting element according to the sixth embodiment.
Figure 19:
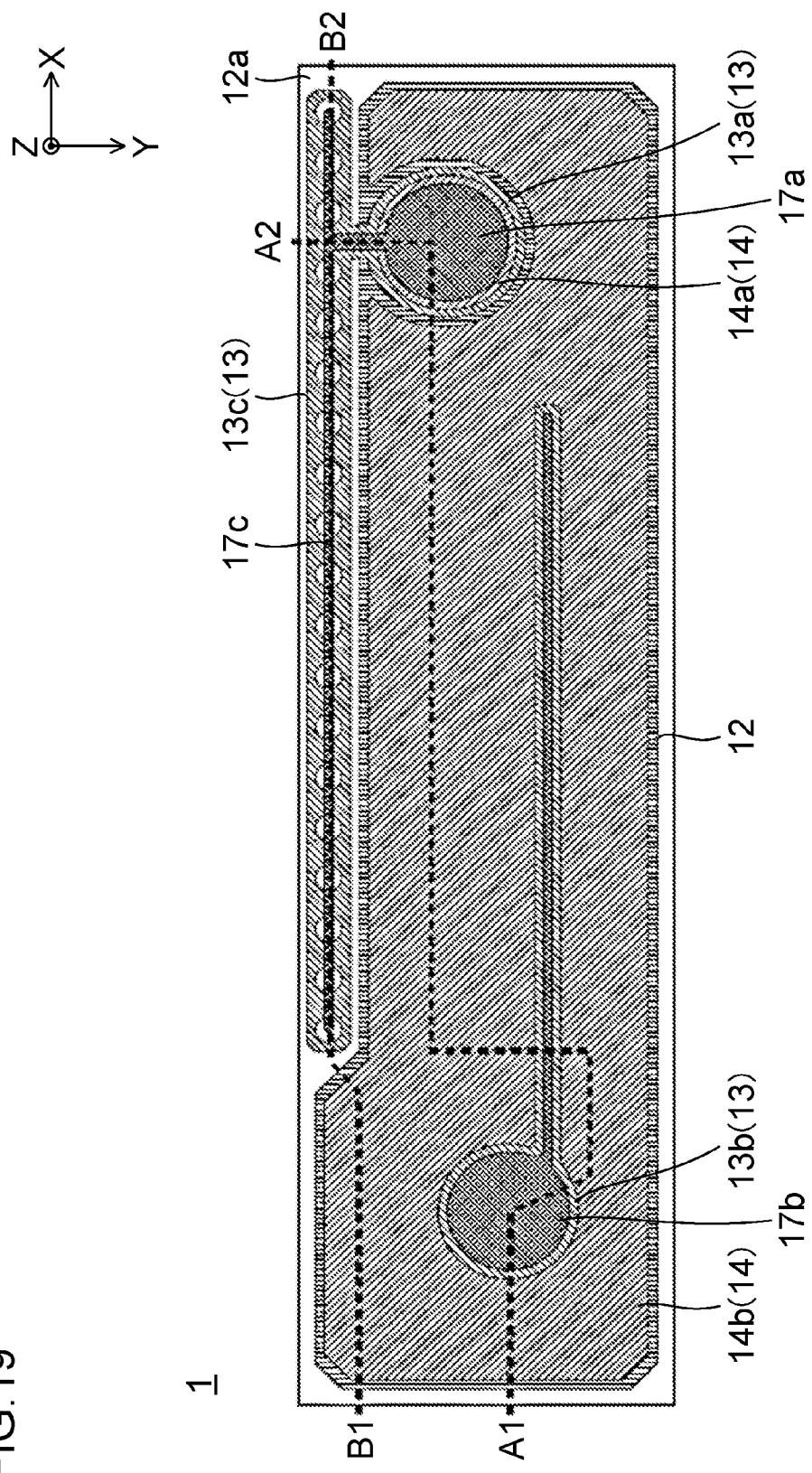
FIG. 19 is a top view of the nitride semiconductor light emitting element according to the sixth embodiment.

FIG. 17 and FIG. 18 are sectional structure views of a nitride semiconductor light emitting element according to a sixth embodiment, and FIG. 19 is a top view of the nitride semiconductor light emitting element according to the sixth embodiment. FIG. 17 illustrates a sectional view taken along an A1-A2 line of FIG. 19, and FIG. 18 illustrates a sectional view taken along a B1-B2 of FIG. 19. In FIG. 17 and FIG. 18, illustration of the substrate 11 is omitted.

In the sixth embodiment, after stacking the current non-injection layer 13, using photolithography, the current non-injection layer, which is provided on a region other than the n-side electrode region and a region other than a region where the p-side electrode is formed, on the nitride semiconductor multilayered portion 12, is removed by etching. Accordingly, as illustrated in FIG. 17 to FIG. 19, the first current non-injection layer 13a, the second current non-injection layer 13b, the first current non-injection layer 13c formed on a region of the exposed portion 12a on the n-type nitride semiconductor layer are separately formed at the same time.

The first current non-injection layer 13c is formed to extend in an extending band shape which becomes a straight line along the X direction in FIG. 19. The first current non-injection layer 13c has an area when seen from the Z direction in FIG. 19 wider than an area of the extending portion 17c of the n-side electrode 17a. Also, in the first current non-injection layer 13c, the center portion in the Y direction in FIG. 19 is removed in dotted shape in which dots are formed to be scattered with predetermined intervals along the X direction. The extending portion 17c of the n-side electrode 17a extends in a band shape which becomes a straight line along the X direction on an upper side of the first current non-injection layer 13c, so as to be over a position where the plurality of first current non-injection layers 13c, which are scattered, are removed. The extending portion 17c of the n-side electrode 17a is conducted to the n-type nitride semiconductor layer on a position where the first current non-injection layers 13c in dotted shape are removed.

The embodiment differs from the first embodiment to the third embodiment in that the first current non-injection layer 13c is formed on a region under the extending portion 17c of the n-side electrode 17a.

In the embodiment also, in the same manner as that of the fourth embodiment and the fifth embodiment, compared to a case in which the first current non-injection layer is not formed under the extending portion 17c of the n-side electrode 17a, the reflectivity of light from the light emitting layer is improved, and light extraction efficiency of the nitride semiconductor light emitting element 1 is improved.

[Seventh Embodiment]

Figure 20:
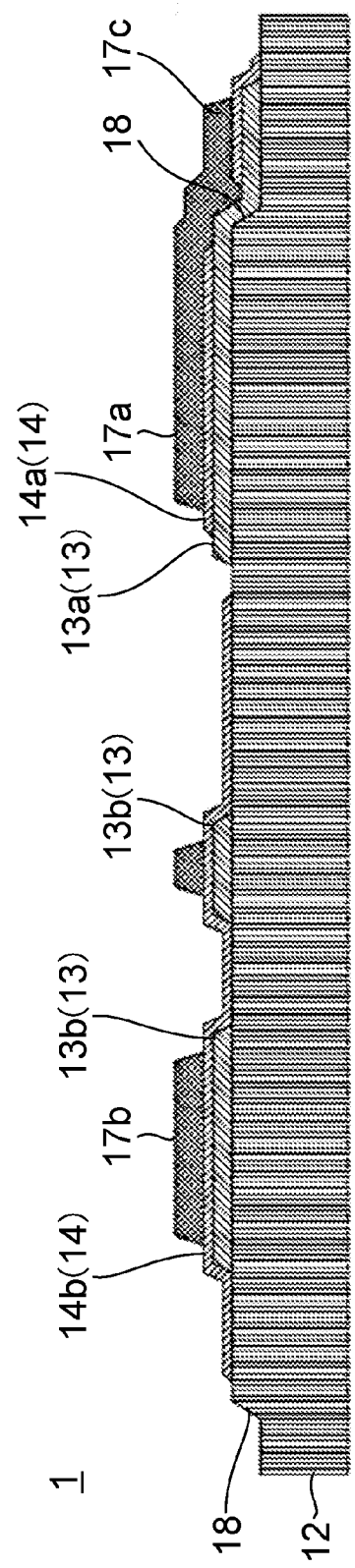
FIG. 20 is a sectional structure view of a nitride semiconductor light emitting element according to a seventh embodiment.
Figure 21:
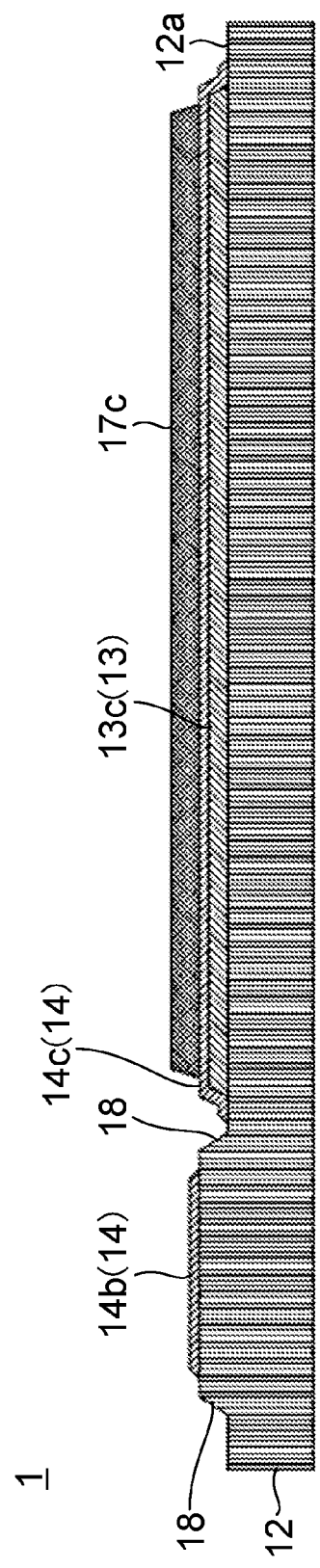
FIG. 21 is a sectional structure view of the nitride semiconductor light emitting element according to the seventh embodiment.
Figure 22:
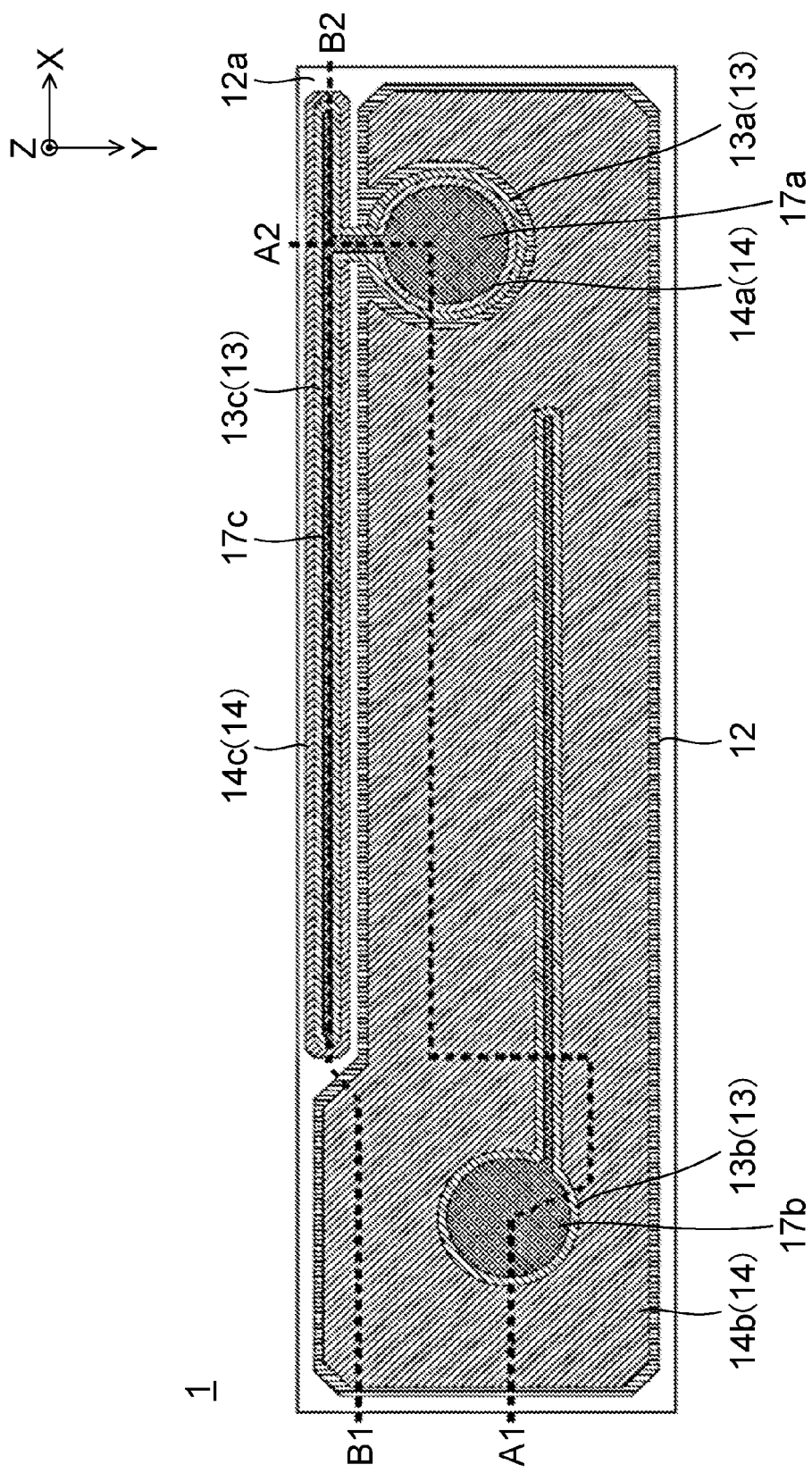
FIG. 22 is a top view of the nitride semiconductor light emitting element according to the seventh embodiment.

FIG. 20 and FIG. 21 are sectional structure views of a nitride semiconductor light emitting element according to a seventh embodiment, and FIG. 22 is a top view of the nitride semiconductor light emitting element according to the seventh embodiment. FIG. 20 illustrates a sectional view taken along an A1-A2 line of FIG. 22, and FIG. 21 illustrates a sectional view taken along a B1-B2 line of FIG. 22. In FIG. 20 and FIG. 21, illustration of the substrate 11 is omitted.

In the seventh embodiment, after stacking the current non-injection layer 13, using photolithography, the current non-injection layer, which is provided on a region other than the n-side electrode region and a region other than a region where the p-side electrode is formed, on the nitride semiconductor multilayered portion 12, is removed by etching. Accordingly, as illustrated in FIG. 20 to FIG. 22, the first current non-injection layer 13a, the second current non-injection layer 13b, the first current non-injection layer 13c formed on a region of the exposed portion 12a on the n-type nitride semiconductor layer are separately formed at the same time.

Next, using photolithography, the peripheral portion of the nitride semiconductor multilayered portion 12, and regions other than the second region on the main surface of the nitride semiconductor multilayered portion 12 and the current diffusing layer 14 formed on the first current non-injection layer 13a are removed by etching. Accordingly, the first current diffusing layer 14a, the second current diffusing layer 14b, and the first current diffusing layer 14c formed on a region of the exposed portion 12a on the n-type nitride semiconductor layer are separately formed at the same time.

Each of the first current non-injection layer 13c, the first current diffusing layer 14c, and the extending portion 17c of the n-side electrode 17a is formed to in an extending band shape which becomes a straight line along the X direction in FIG. 22. Moreover, the first current non-injection layer 13c is formed in a pattern in which the area when seen from the Z direction in FIG. 22 is wider than the area of the extending portion 17c of the n-side electrode 17a. Further, the first current diffusing layer 14c is formed in a pattern in which the area when seen from the Z direction in FIG. 22 is wider than the area of the first current non-injection layer 13c. The extending portion 17c of the n-side electrode 17a is conducted to the n-type nitride semiconductor layer via the first current diffusing layer 14c.

The embodiment differs from the first embodiment to the third embodiment in that the first current non-injection layer 13c is formed on a region or the entire region under the extending portion 17c of the n-side electrode 17a. Further, the embodiment is different from the first embodiment to the third embodiment in that the first current diffusing layer 14c is formed on a region or the entire region under the extending portion 17c of the n-side electrode 17a.

For example, in a case where the first current non-injection layer and the first current diffusing layer are not formed under the extending portion 17c of the n-side electrode 17a, the reflectivity of light from the light emitting layer becomes 80.1%. If the first current non-injection layer 13c and the first current diffusing layer 14c are partially formed under the extending portion 17c of the n-side electrode 17a, the reflectivity of light from the light emitting layer becomes 95.6%, and thus the reflectivity is improved. The entirety under the extending portion 17c of the n-side electrode 17a can be covered with the first current non-injection layer 13c and the first current diffusing layer 14c, and the entirety under the extending portion 17c of the n-side electrode 17a can be formed to have a structure with higher reflectivity. Therefore, the light extraction efficiency of the nitride semiconductor light emitting element 1 can be improved. Further, increasing of a voltage can be suppressed because current is diffused on the first current diffusing layer 14c.

[Eighth Embodiment]

Figure 23:
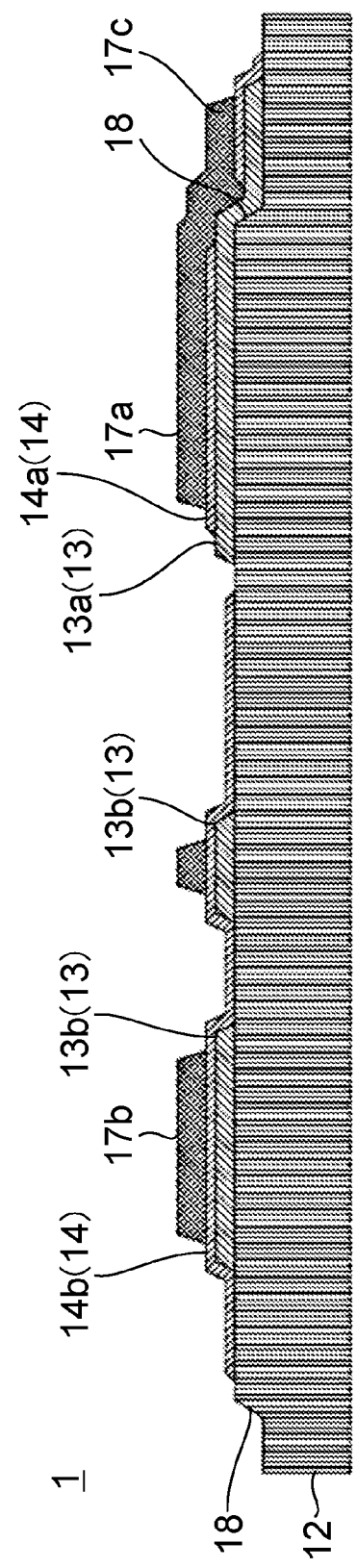
FIG. 23 is a sectional structure view of a nitride semiconductor light emitting element according to an eighth embodiment.
Figure 24:
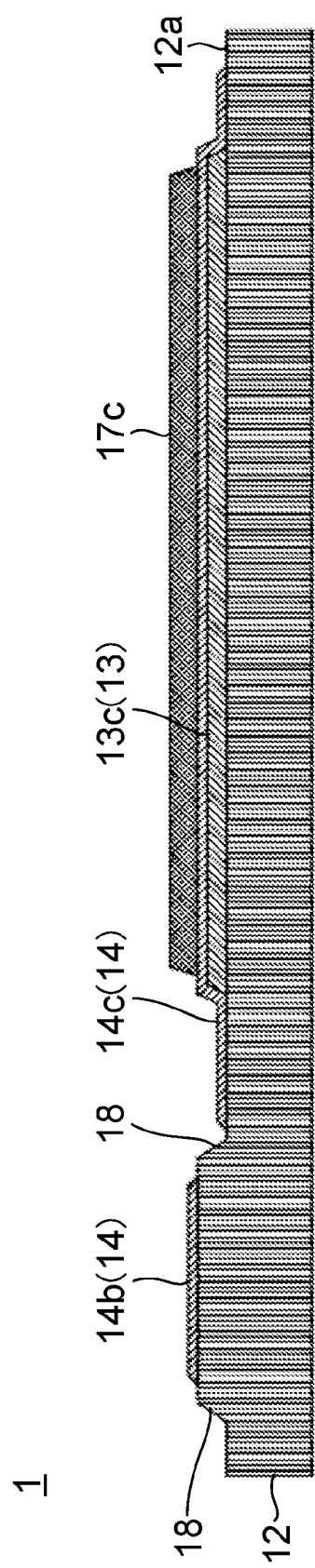
FIG. 24 is a sectional structure view of the nitride semiconductor light emitting element according to the eighth embodiment.
Figure 25:
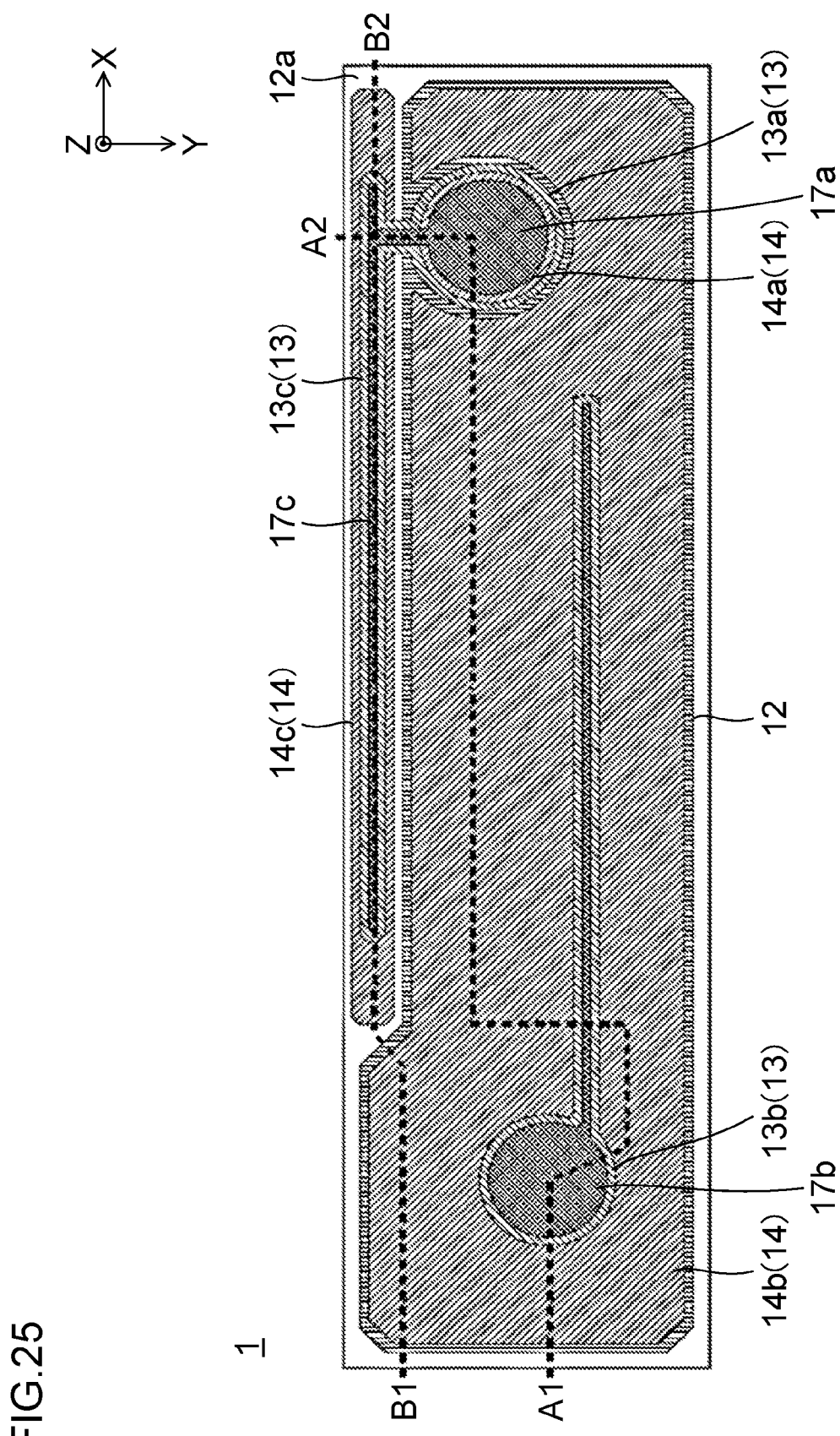
FIG. 25 is a top view of the nitride semiconductor light emitting element according to the eighth embodiment.

FIG. 23 and FIG. 24 are sectional structure views of a nitride semiconductor light emitting element according to an eighth embodiment, and FIG. 25 is a top view of the nitride semiconductor light emitting element according to the eighth embodiment. FIG. 23 illustrates a sectional view taken along an A1-A2 line of FIG. 25, and FIG. 24 illustrates a sectional view taken along a B1-B2 line of FIG. 25. In FIG. 23 and FIG. 24, illustration of the substrate 11 is omitted.

In the eighth embodiment, after stacking the current non-injection layer 13, using photolithography, the current non-injection layer, which is provided on a region other than the n-side electrode region and a region other than a region where the p-side electrode is formed, on the nitride semiconductor multilayered portion 12, is removed by etching. Accordingly, as illustrated in FIG. 23 to FIG. 25, the first current non-injection layer 13a, the second current non-injection layer 13b, the first current non-injection layer 13c formed on a region of the exposed portion 12a on the n-type nitride semiconductor layer are separately formed at the same time.

Next, using photolithography, the peripheral portion of the nitride semiconductor multilayered portion 12, and regions other than the second region on the main surface of the nitride semiconductor multilayered portion 12 and the current diffusing layer 14 formed on the first current non-injection layer 13a are removed by etching. Accordingly, the first current diffusing layer 14a, the second current diffusing layer 14b, and the first current diffusing layer 14c formed on a region of the exposed portion 12a on the n-type nitride semiconductor layer are separately formed at the same time.

Each of the first current non-injection layer 13c, the first current diffusing layer 14c, and the extending portion 17c of the n-side electrode 17a are formed in an extending band shape which becomes a straight line along the X direction in FIG. 25. As illustrated in FIG. 24 and FIG. 25, each length in the X direction with respect to the first current diffusing layer 14c of each of the first current non-injection layer 13c and the extending portion 17c of the n-side electrode 17a of the eighth embodiment is shorter than that of the first current non-injection layer 13c and the extending portion 17c of the n-side electrode 17a of the seventh embodiment (refer to FIG. 21 and FIG. 22).

The embodiment is different from the first embodiment to the third embodiment in that the first current non-injection layer 13c is formed on a region or the entire region under the extending portion 17c of the n-side electrode 17a. Further, the embodiment is different from the first embodiment to the third embodiment in that the first current diffusing layer 14c is formed on a region or the entire region under the extending portion 17c of the n-side electrode 17a.

In the embodiment also, in the same manner as the seventh embodiment, compared to a case in which the first current non-injection layer and the first current diffusing layer are not formed under the extending portion 17c of the n-side electrode 17a, the reflectivity of light from the light emitting layer is improved, the light extraction efficiency of the nitride semiconductor light emitting element 1 is improved, and increasing of a voltage can be suppressed.

Since a length in the X direction in FIG. 25 of the first current non-injection layer 13c and the extending portion 17c of the n-side electrode 17a is relatively shorter than a length in the X direction of the first current diffusing layer 14c, absorption or shielding of light from the light emitting layer in the extending portion 17c of the n-side electrode 17a can be reduced. Accordingly, the light extraction efficiency of the nitride semiconductor light emitting element 1 can be further improved.

[Ninth Embodiment]

Figure 26:
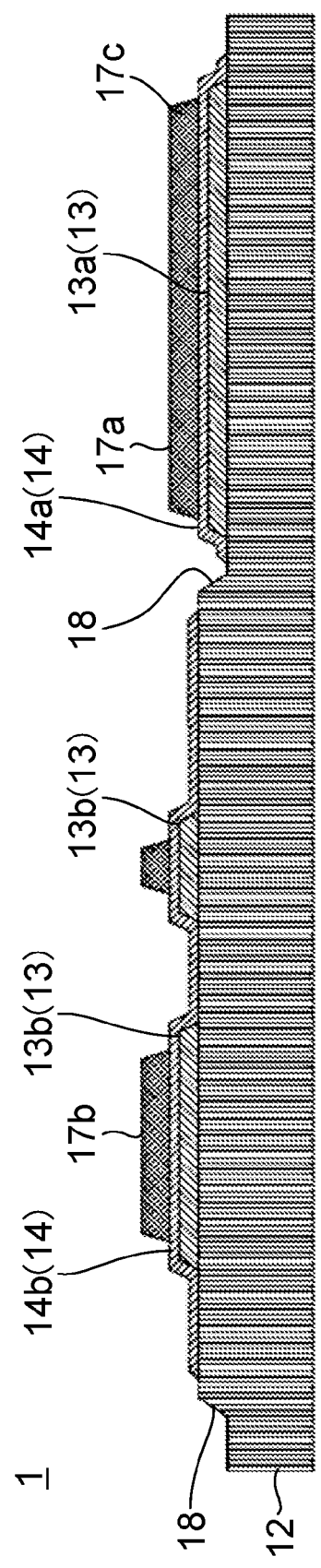
FIG. 26 is a sectional structure view of a nitride semiconductor light emitting element according to a ninth embodiment.
Figure 27:
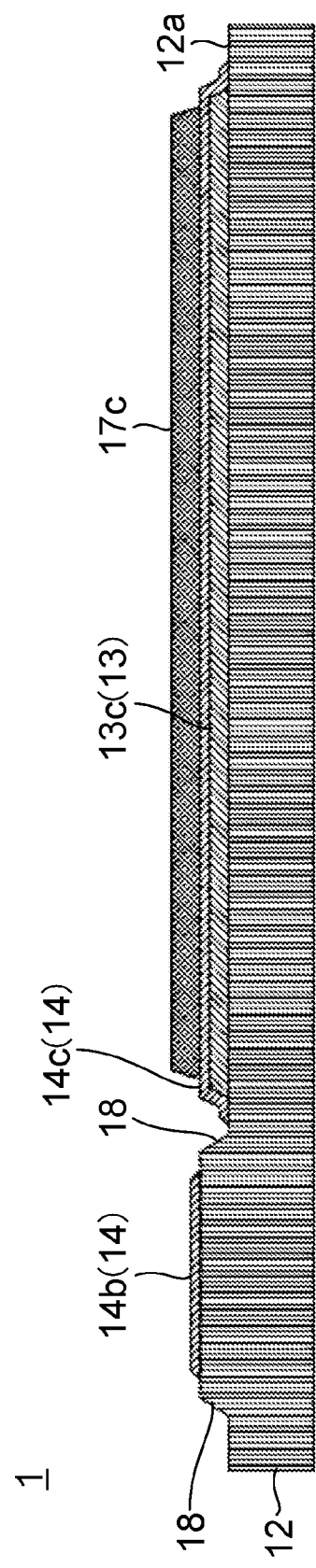
FIG. 27 is a sectional structure view of the nitride semiconductor light emitting element according to the ninth embodiment.
Figure 28:
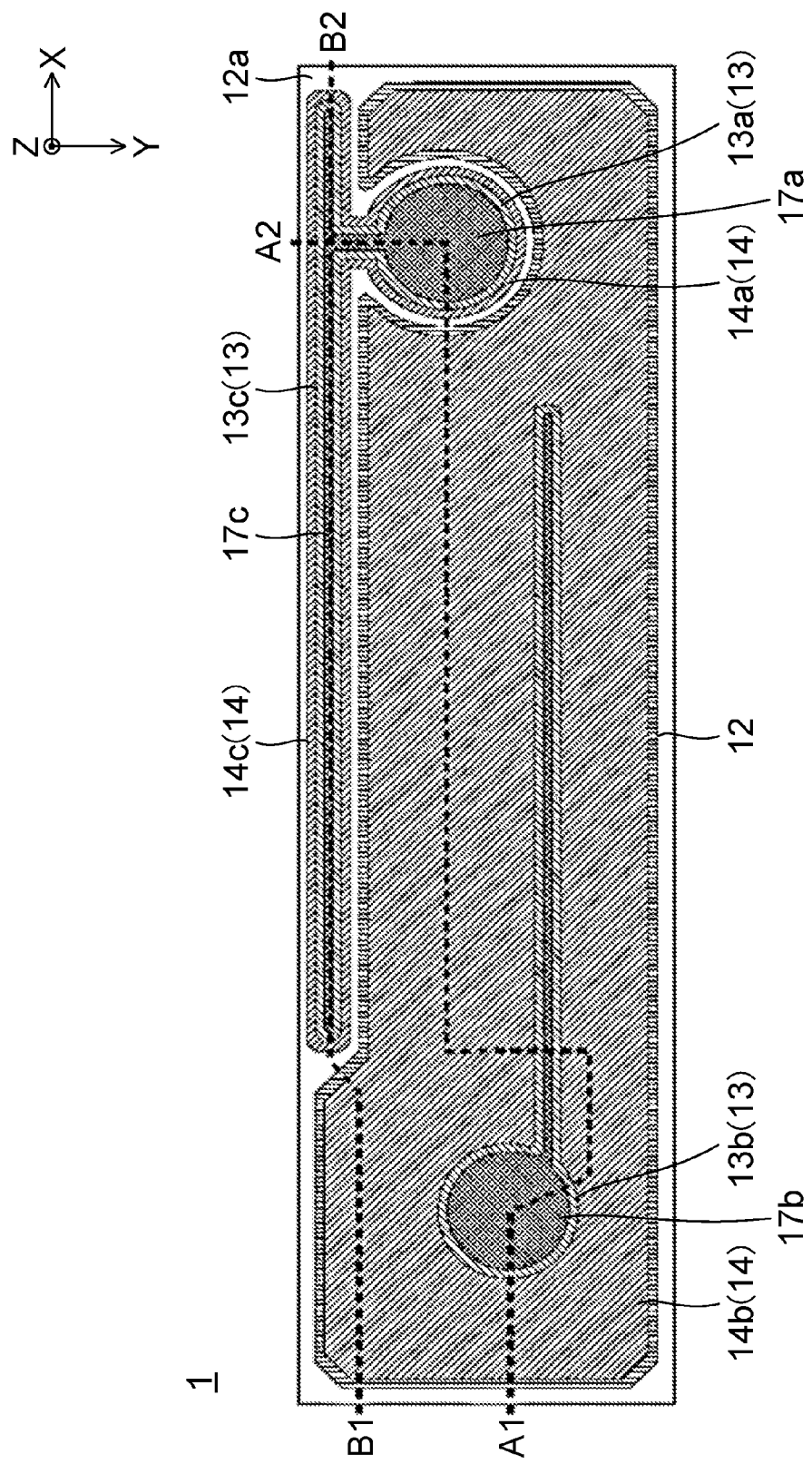
FIG. 28 is a top view of the nitride semiconductor light emitting element according to the ninth embodiment.

FIG. 26 and FIG. 27 are sectional structure views of a nitride semiconductor light emitting element according to a ninth embodiment, and FIG. 28 is a top view of the nitride semiconductor light emitting element according to the ninth embodiment. FIG. 26 illustrates a sectional view taken along an A1-A2 line of FIG. 28, and FIG. 27 illustrates a sectional view taken along a B1-B2 line of FIG. 28. In FIG. 26 and FIG. 27, illustration of the substrate 11 is omitted.

In the ninth embodiment, after stacking the current non-injection layer 13, using photolithography, the current non-injection layer, which is provided on a region other than the n-side electrode region and a region other than a region where the p-side electrode is formed, on the nitride semiconductor multilayered portion 12, is removed by etching. Accordingly, as illustrated in FIG. 26 to FIG. 28, the first current non-injection layer 13a, the second current non-injection layer 13b, and the first current non-injection layer 13c are separately formed at the same time. The first current non-injection layer 13a and the first current non-injection layer 13c are formed on a region of the exposed portion 12a on the n-type nitride semiconductor layer.

Next, using photolithography, the peripheral portion of the nitride semiconductor multilayered portion 12, and regions other than the second region on the main surface of the nitride semiconductor multilayered portion 12 and the current diffusing layer 14 formed on the first current non-injection layer 13a are removed by etching. Accordingly, the first current diffusing layer 14a, the second current diffusing layer 14b, and the first current diffusing layer 14c are separately formed at the same time. The first current diffusing layer 14a and the first current diffusing layer 14c are formed on a region of the exposed portion 12a on the n-type nitride semiconductor layer.

The first current non-injection layer 13a and the first current non-injection layer 13c are formed in a pattern in which an area when seen from the Z direction in FIG. 28 is wider than an area of the n-side electrode 17a and the extending portion 17c of the n-side electrode 17a. Further, the first current diffusing layer 14a and the first current diffusing layer 14c are formed in a pattern in which an area when seen from the Z direction in FIG. 28 is wider than an area of the first current non-injection layer 13a and the first current non-injection layer 13c.

The embodiment is different from the first embodiment to the third embodiment in that the n-side electrode 17a and the extending portion 17c of the n-side electrode 17a are formed on the exposed portion 12a on the n-type nitride semiconductor layer, and the first current non-injection layer 13a and the first current non-injection layer 13c are formed on a region or the entire region under the n-side electrode 17a and the extending portion 17c of the n-side electrode 17a. Further, the embodiment differs from the first embodiment to the third embodiment in that the first current diffusing layer 14a and the first current diffusing layer 14c are formed on a region or the entire region under the n-side electrode 17a and the extending portion 17c of the n-side electrode 17a.

In the embodiment also, in the same manner as the seventh embodiment, compared to a case in which the first current non-injection layer and the first current diffusing layer are not formed under the extending portion 17c of the n-side electrode 17a, the reflectivity of light from the light emitting layer is improved, the light extraction efficiency of the nitride semiconductor light emitting element 1 is improved, and further increasing of a voltage can be suppressed.

[Tenth Embodiment]

Figure 29:
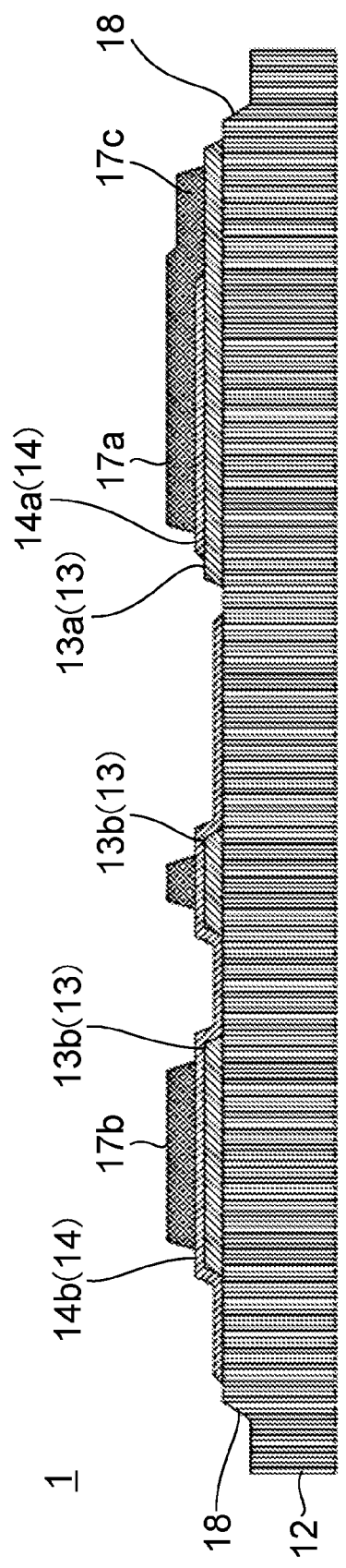
FIG. 29 is a sectional structure view of a nitride semiconductor light emitting element according to a tenth embodiment.
Figure 30:
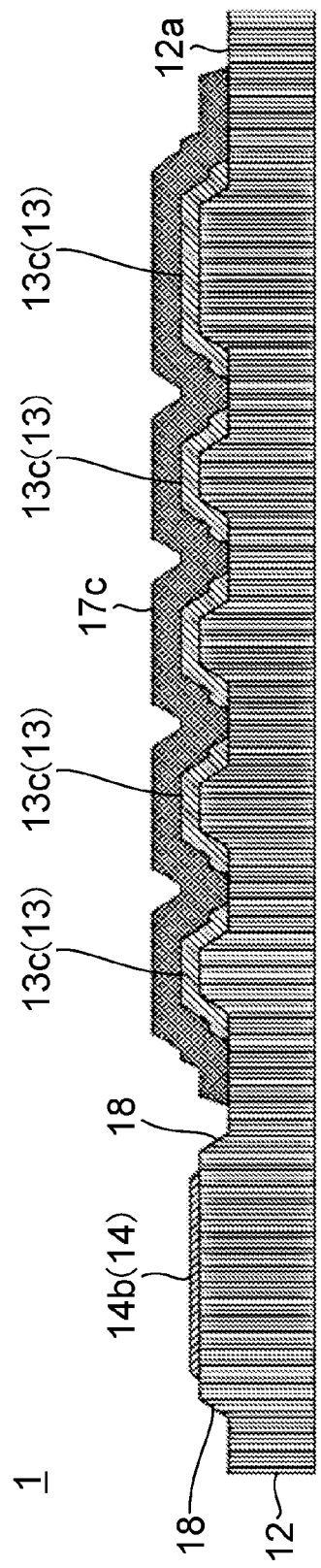
FIG. 30 is a sectional structure view of the nitride semiconductor light emitting element according to the tenth embodiment.
Figure 31:
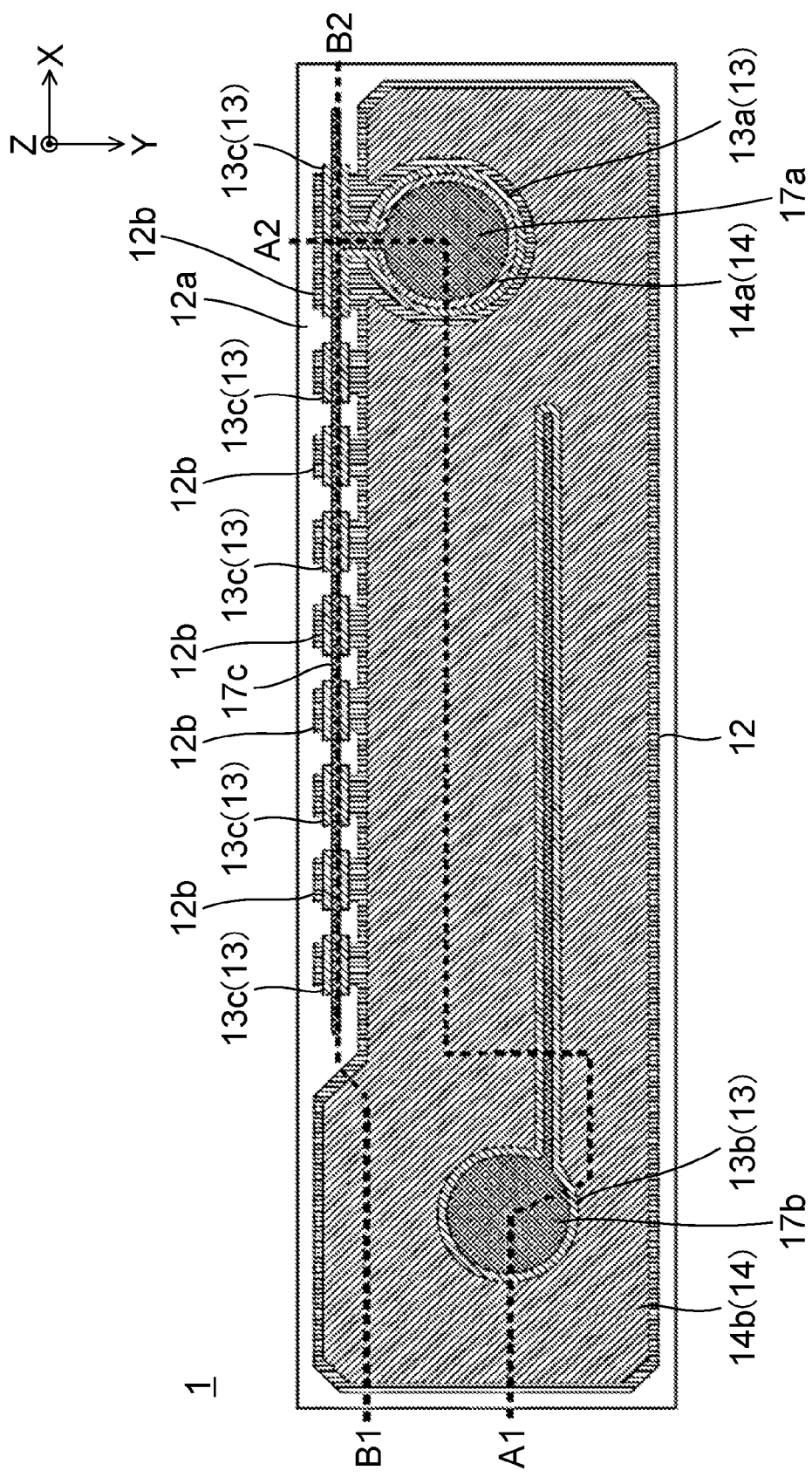
FIG. 31 is a top view of the nitride semiconductor light emitting element according to the tenth embodiment.

FIG. 29 and FIG. 30 are sectional structure views of a nitride semiconductor light emitting element according to a tenth embodiment, and FIG. 31 is a top view of the nitride semiconductor light emitting element according to the tenth embodiment. FIG. 29 illustrates a sectional view taken along an A1-A2 line of FIG. 31, and FIG. 30 illustrates a sectional view taken along a B1-B2 line of FIG. 31. In FIG. 29 and FIG. 30, illustration of the substrate 11 is omitted.

In the tenth embodiment, after stacking the current non-injection layer 13, using photolithography, the current non-injection layer, which is provided on a region other than the n-side electrode region and a region other than a region where the p-side electrode is formed, on the nitride semiconductor multilayered portion 12, is removed by etching. Accordingly, as illustrated in FIG. 29 to FIG. 31, the first current non-injection layer 13a, the second current non-injection layer 13b, and the first current non-injection layer 13c which is formed on a region on the p-type nitride semiconductor layer and a region of the exposed portion 12a on the n-type nitride semiconductor layer are separately formed at the same time.

The first current non-injection layers 13c are formed to be scattered with predetermined intervals along the X direction FIG. 31. Under the first current non-injection layers 13c, in the nitride semiconductor multilayered portion 12, the projection portion 12b including the p-type nitride semiconductor layer on the upper layer thereof, and a recess portion formed of the exposed portion 12a in which the p-type nitride semiconductor layer and the active layer are removed to the n-type nitride semiconductor layer, are respectively formed. Each projection portion 12b of the nitride semiconductor multilayered portion 12 extends in a comb shape along the Y direction in FIG. 31 toward a region where the first current non-injection layer 13c is formed. That is, under the first current non-injection layer 13c, the projection portion 12b and the exposed portion 12a, which is a recess portion, of the nitride semiconductor multilayered portion 12 are alternately arranged along the X direction.

The first current non-injection layer 13c covers over the projection portions 12b of the nitride semiconductor multilayered portion 12 along the X direction, and extends between adjacent recess portions (exposed portions 12a). The extending portion 17c of the n-side electrode 17a extends in a band shape which becomes a straight line along the X direction so as to be over the plurality of first current non-injection layers 13c, which are scattered, on an upper side of the first current non-injection layer 13c. The extending portion 17c of the n-side electrode 17a comes into contact with the n-type nitride semiconductor layer so as to be conducted thereto in a position (recess portion) between the plurality of first current non-injection layers 13c, which are scattered, or both end portions in the X direction.

The embodiment differs from the first embodiment to the third embodiment in that the first current non-injection layer 13c is formed on a region on the p-type nitride semiconductor layer and a region on the exposed portion 12a on the n-type nitride semiconductor layer.

In the embodiment also, in the same manner as the fourth embodiment, compared to a case in which the first current non-injection layer is not formed under the extending portion 17c of the n-side electrode 17a, the reflectivity of light from the light emitting layer is improved, and light extraction efficiency of the nitride semiconductor light emitting element 1 is improved. Further, since the p-type nitride semiconductor layer exists under the first current non-injection layer 13c, reduction in the light emitting area can be suppressed.

[Eleventh Embodiment]

Figure 32:
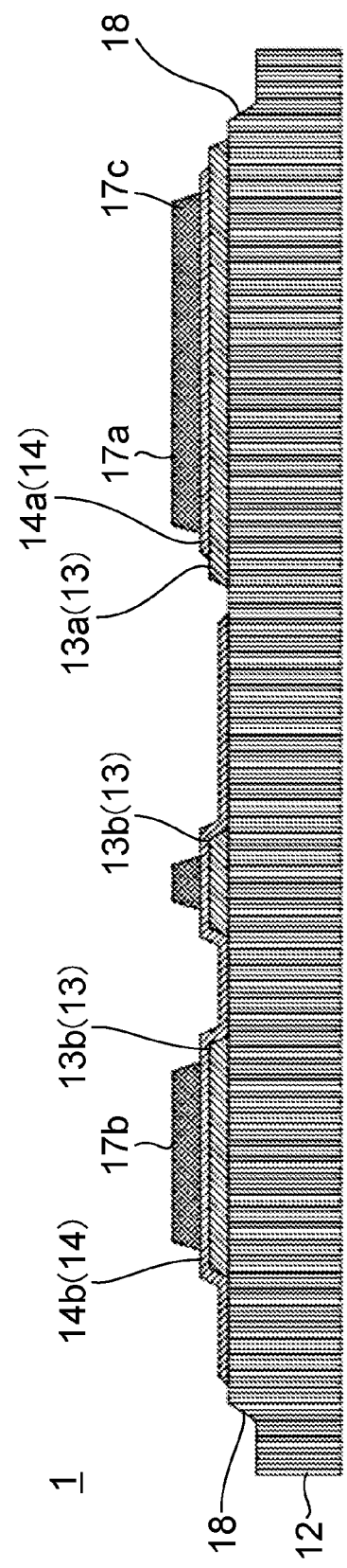
FIG. 32 is a sectional structure view of a nitride semiconductor light emitting element according to an eleventh embodiment.
Figure 33:
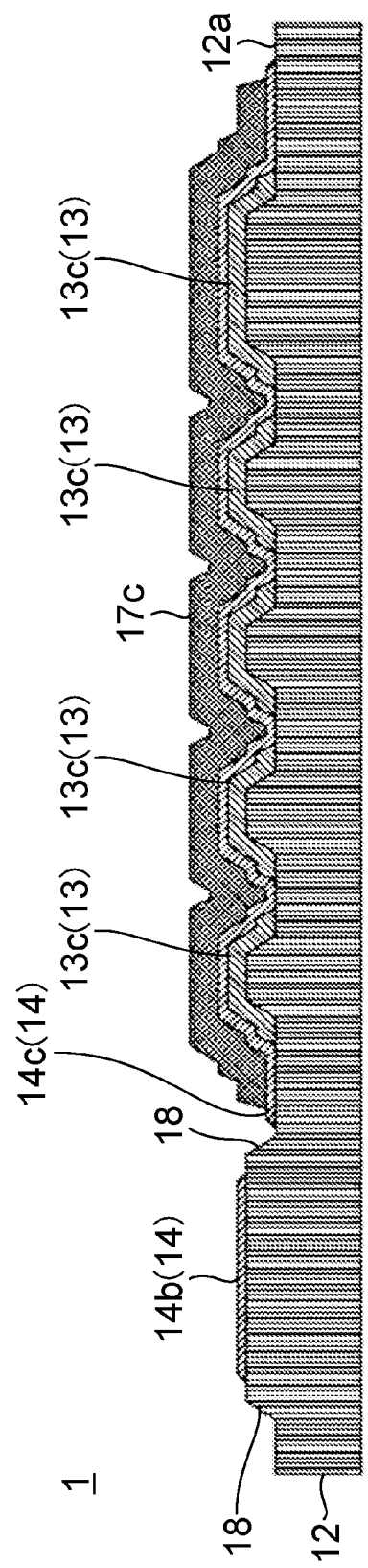
FIG. 33 is a sectional structure view of the nitride semiconductor light emitting element according to the eleventh embodiment.
Figure 34:
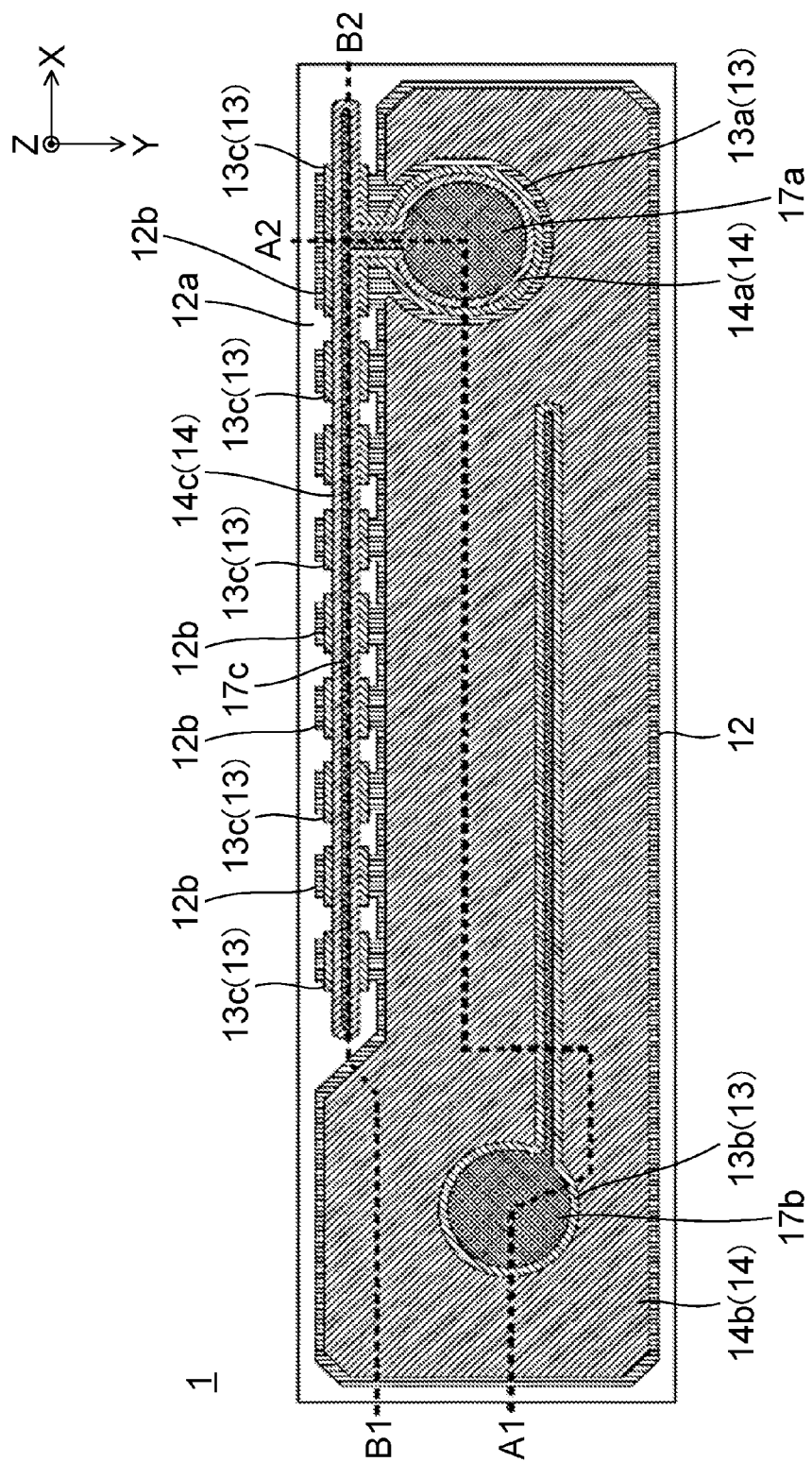
FIG. 34 is a top view of the nitride semiconductor light emitting element according to the eleventh embodiment.

FIG. 32 and FIG. 33 are sectional structure views of a nitride semiconductor light emitting element according to an eleventh embodiment, and FIG. 34 is a top view of the nitride semiconductor light emitting element according to the eleventh embodiment. FIG. 32 illustrates a sectional view taken along an A1-A2 line of FIG. 34, and FIG. 33 illustrates a sectional view taken along a B1-B2 line of FIG. 34. In FIG. 32 and FIG. 33, illustration of the substrate 11 is omitted.

In the eleventh embodiment, after stacking the current non-injection layer 13, using photolithography, the current non-injection layer, which is provided on a region other than the n-side electrode region and a region other than a region where the p-side electrode is formed, on the nitride semiconductor multilayered portion 12, is removed by etching. Accordingly, as illustrated in FIG. 32 to FIG. 34, the first current non-injection layer 13a, the second current non-injection layer 13b, and the first current non-injection layer 13c which is formed on a region on the p-type nitride semiconductor layer and a region on the exposed portion 12a on the n-type nitride semiconductor layer are separately formed at the same time.

Next, using photolithography, the peripheral portion of the nitride semiconductor multilayered portion 12, and regions other than the second region on the main surface of the nitride semiconductor multilayered portion 12 and the current diffusing layer 14 formed on the first current non-injection layer 13a are removed by etching. Accordingly, the first current diffusing layer 14a, the second current diffusing layer 14b, and the first current diffusing layer 14c formed on a region on the p-type nitride semiconductor layer and a region on the exposed portion 12a on the n-type nitride semiconductor layer are separately formed at the same time.

Each projection portion 12b of the nitride semiconductor multilayered portion 12 extends in a comb shape along the Y direction in FIG. 34 toward a region where the first current non-injection layer 13c is formed. That is, under the first current non-injection layer 13c, the projection portion 12b and the exposed portion 12a which is a recess portion of the nitride semiconductor multilayered portion 12 are alternately arranged along the X direction. The first current non-injection layers 13c are formed to be scattered with predetermined intervals along the X direction of FIG. 34, cover over the projection portions 12*b* of the nitride semiconductor multilayered portion 12 along the X direction, and extend between adjacent recess portions (exposed portions 12*a*).

The first current diffusing layer 14*c* extends in a band shape which becomes a straight line along the X direction on the upper side of the first current non-injection layers 13*c* so as to be over the plurality of first current non-injection layers 13*c*, which are scattered. The first current diffusing layer 14*c* comes into contact with the n-type nitride semiconductor layer so as to be conducted thereto in a position (recess portion) between the plurality of first current non-injection layers 13*c*, which are scattered, or both end portions in the X direction. Further, the first current diffusing layer 14*c* is formed in a pattern in which an area when seen from the Z direction in FIG. 34 is wider than an area of the extending portion 17*c* of the n-side electrode 17*a*.

The extending portion 17*c* of the n-side electrode 17*a* extends in a band shape which becomes a straight line along the X direction on an upper side of the first current diffusing layer 14*c*, in the same manner as the first current diffusing layer 14*c*. The extending portion 17*c* of the n-side electrode 17*a* is conducted to the n-type nitride semiconductor layer via the first current diffusing layer 14*c*.

The embodiment differs from the first embodiment to the third embodiment in that the first current non-injection layer 13*c* is formed on a region on the p-type nitride semiconductor layer and a region on the exposed portion 12*a* on the n-type nitride semiconductor layer. Further, the embodiment differs from the first embodiment to the third embodiment in that the first current diffusing layer 14*c* is formed on a region on the p-type nitride semiconductor layer and a region on the exposed portion 12*a* on the n-type nitride semiconductor layer.

For example, in a case where the first current non-injection layer and the first current diffusing layer are not formed under the extending portion 17*c* of the n-side electrode 17*a*, the reflectivity of light from the light emitting layer becomes 80.1%. Also, in a case where only the first current diffusing layer is formed under the extending portion 17*c* of the n-side electrode 17*a*, the reflectivity of light from the light emitting layer becomes 75.3%. If the first current non-injection layer 13*c* is partially formed under the extending portion 17*c* of the n-side electrode 17*a*, and the first current diffusing layer 14*c* is formed entirely, the reflectivity of light from the light emitting layer becomes 95.6%, and the reflectivity is improved. When a coverage ratio is improved by the first current non-injection layer 13*c* and the first current diffusing layer 14*c* under the extending portion 17*c* of the n-side electrode 17*a*, an area where relatively high reflectivity is obtained is increased, and light extraction efficiency of the nitride semiconductor light emitting element 1 is improved. Further, since the p-type nitride semiconductor layer exists under the first current non-injection layer 13*c*, reduction in the light emitting area can be suppressed.

[Twelfth Embodiment]

Figure 35:
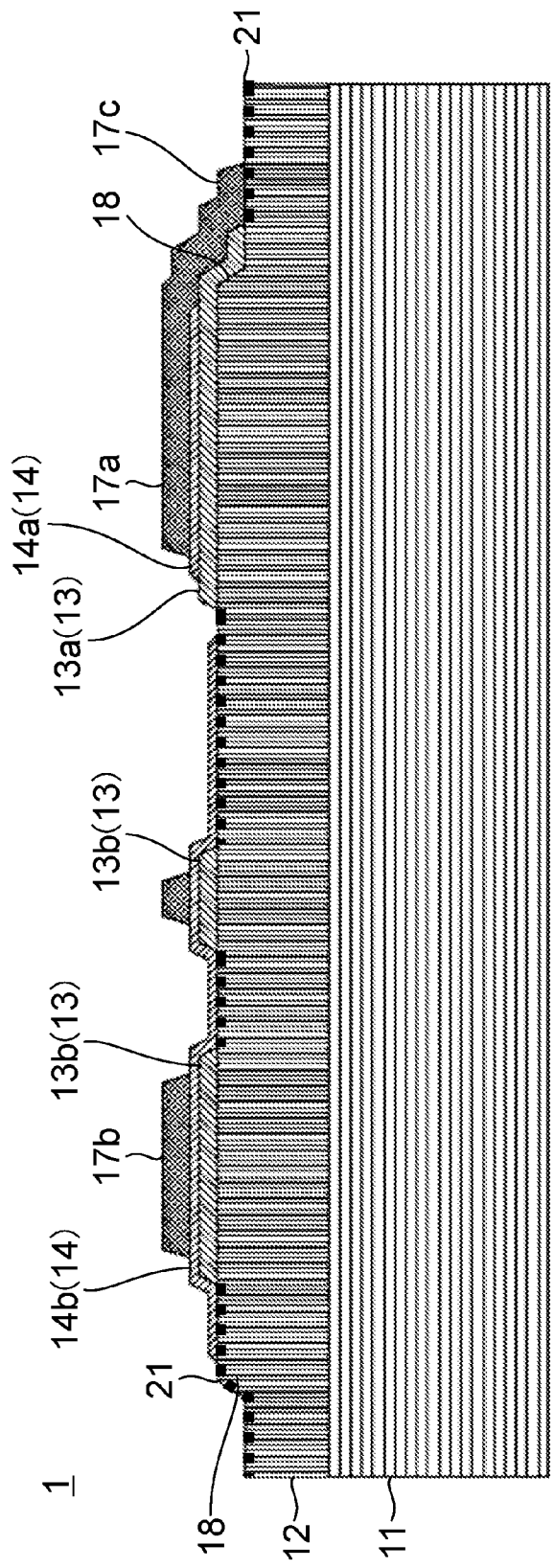
FIG. 35 is a sectional structure view of a nitride semiconductor light emitting element according to a twelfth embodiment.
Figure 36:
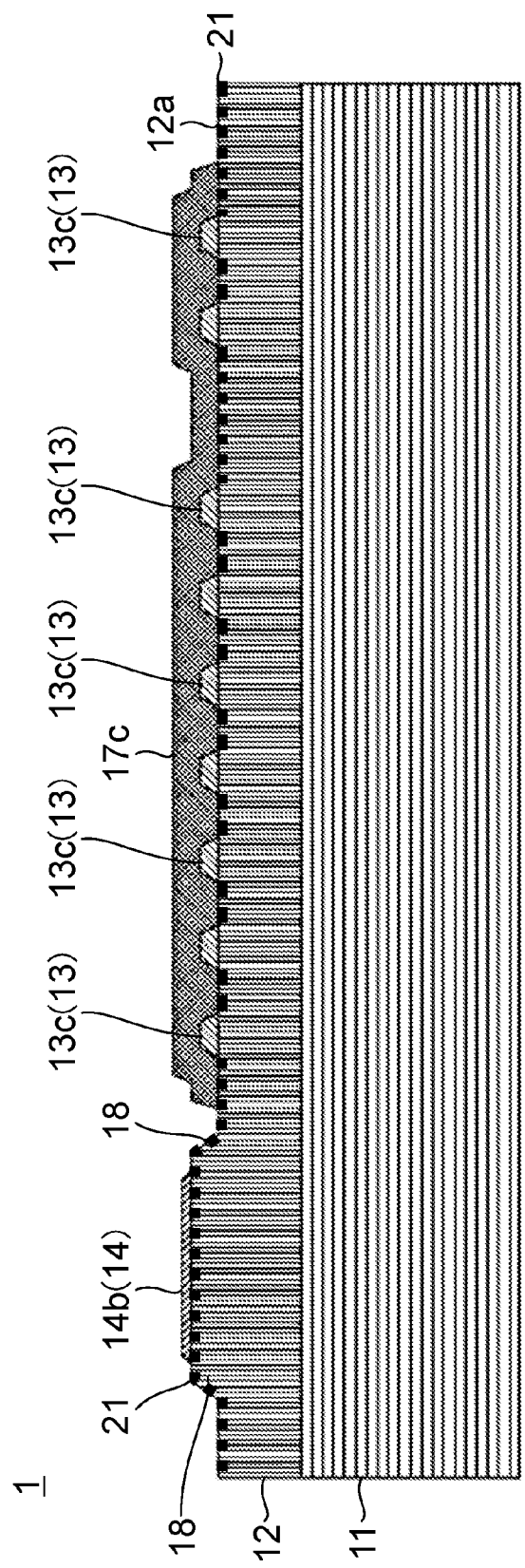
FIG. 36 is a sectional structure view of the nitride semiconductor light emitting element according to the twelfth embodiment.
Figure 37:
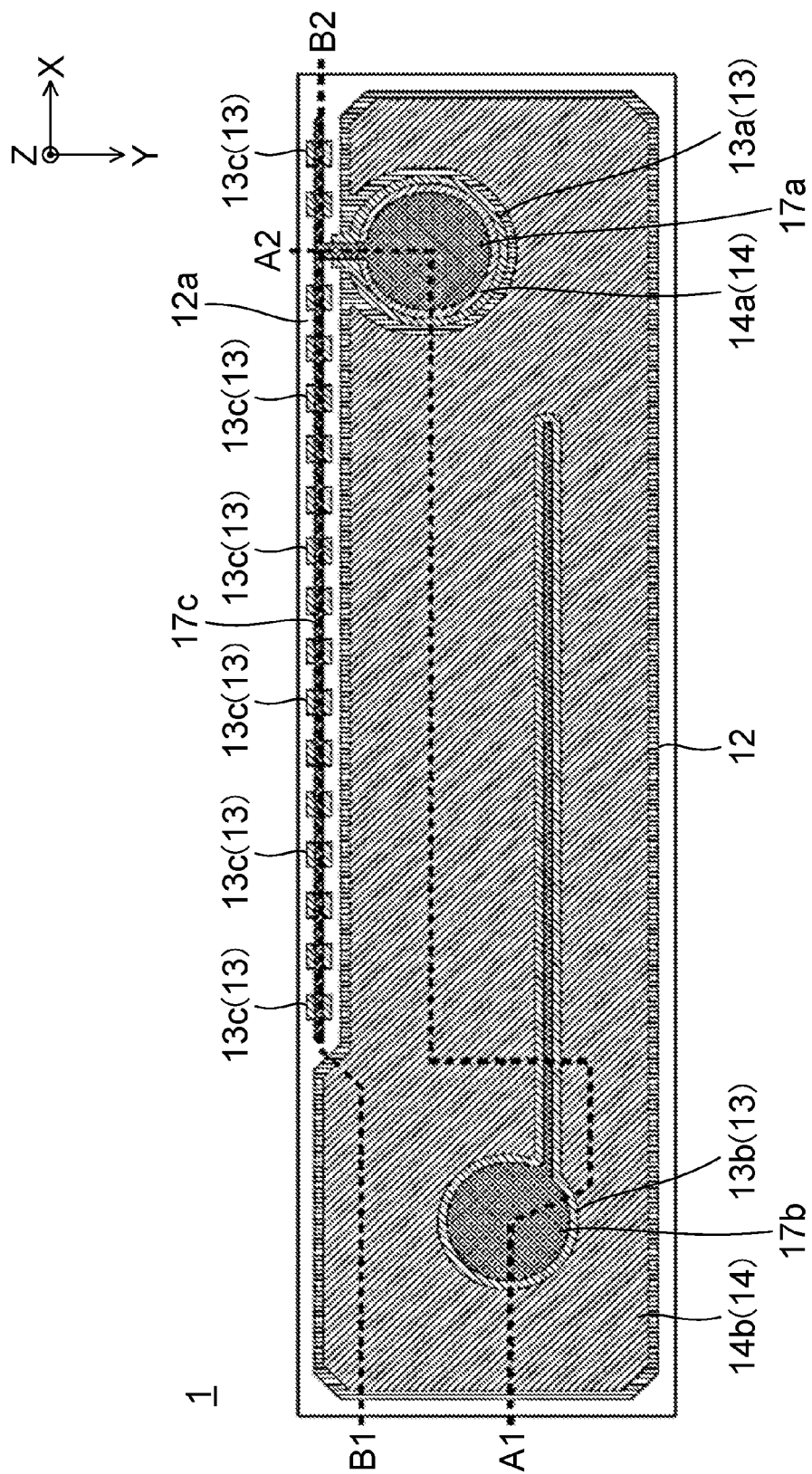
FIG. 37 is a top view of the nitride semiconductor light emitting element according to the twelfth embodiment.

FIG. 35 and FIG. 36 are sectional structure views of the nitride semiconductor light emitting element according to the twelfth embodiment, and FIG. 37 is a top view of the nitride semiconductor light emitting element according to the twelfth embodiment. FIG. 35 illustrates a sectional view taken along an A1-A2 line of FIG. 37, and FIG. 36 illustrates a sectional view taken along a B1-B2 line of FIG. 37.

In the twelfth embodiment, after stacking the current non-injection layer 13, using photolithography, the current non-injection layer, which is provided on a region other than the n-side electrode region and a region other than a region where the p-side electrode is formed, on the nitride semiconductor multilayered portion 12, is removed by etching. Accordingly, as illustrated in FIG. 35 to FIG. 37, the first current non-injection layer 13*a*, the second current non-injection layer 13*b*, and the first current non-injection layer 13*c* formed on a region of the exposed portion 12*a* on the n-type nitride semiconductor layer are separately formed at the same time.

Next, a process of roughening up a surface is performed with respect to the surface of the nitride semiconductor multilayered portion 12 in which the current non-injection layer is removed in a previous process, as illustrated in FIG. 35 and FIG. 36, and thus a rough surface portion 21 is formed. The rough surface portion 21 may be collectively formed with etching of the current non-injection layer, and may be formed by adding a separating mask pattern.

The configuration of the first current non-injection layer 13*c* and the extending portion 17*c* of the n-side electrode 17*a* is the same as that of the fourth embodiment as described above, and thus description thereof will be omitted here.

The embodiment differs from the first embodiment to the third embodiment in that the first current non-injection layer 13*c* is formed on a region under the extending portion 17*c* of the n-side electrode 17*a*. Further, the embodiment differs from the first embodiment to the third embodiment in that the rough surface portion 21 is formed in which the process roughening up is performed on a surface of the nitride semiconductor multilayered portion 12 from which the current non-injection layer is removed.

In the embodiment also, in the same manner as the fourth embodiment, compared to a case in which the first current non-injection layer is not formed under the extending portion 17*c* of the n-side electrode 17*a*, the reflectivity of light from the light emitting layer is improved, and light extraction efficiency of the nitride semiconductor light emitting element 1 is improved. Further, a contact area is increased by forming the rough surface portion 21 on the surface of the nitride semiconductor multilayered portion 12 in which the current non-injection layer is removed, and a voltage can be reduced.

[Thirteenth Embodiment]

Figure 38:
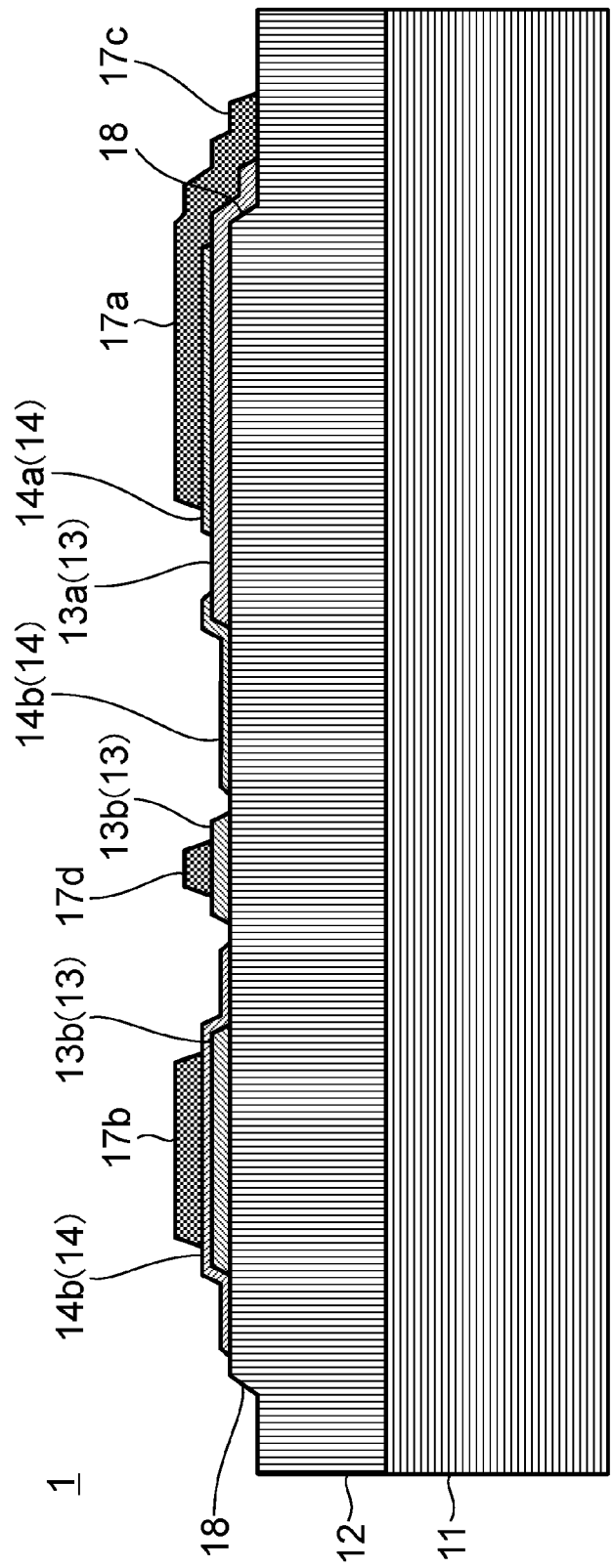
FIG. 38 is a sectional structure view of a nitride semiconductor light emitting element according to a thirteenth embodiment.
Figure 39:
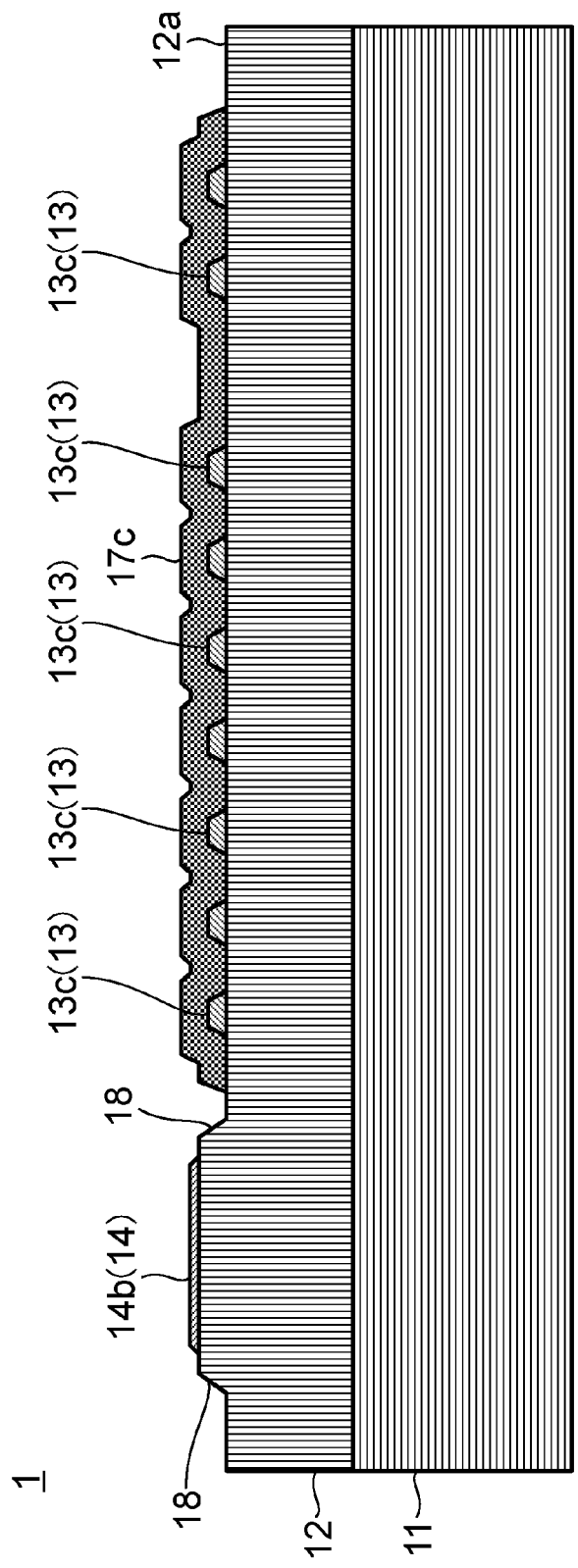
FIG. 39 is a sectional structure view of the nitride semiconductor light emitting element according to the thirteenth embodiment.
Figure 40:
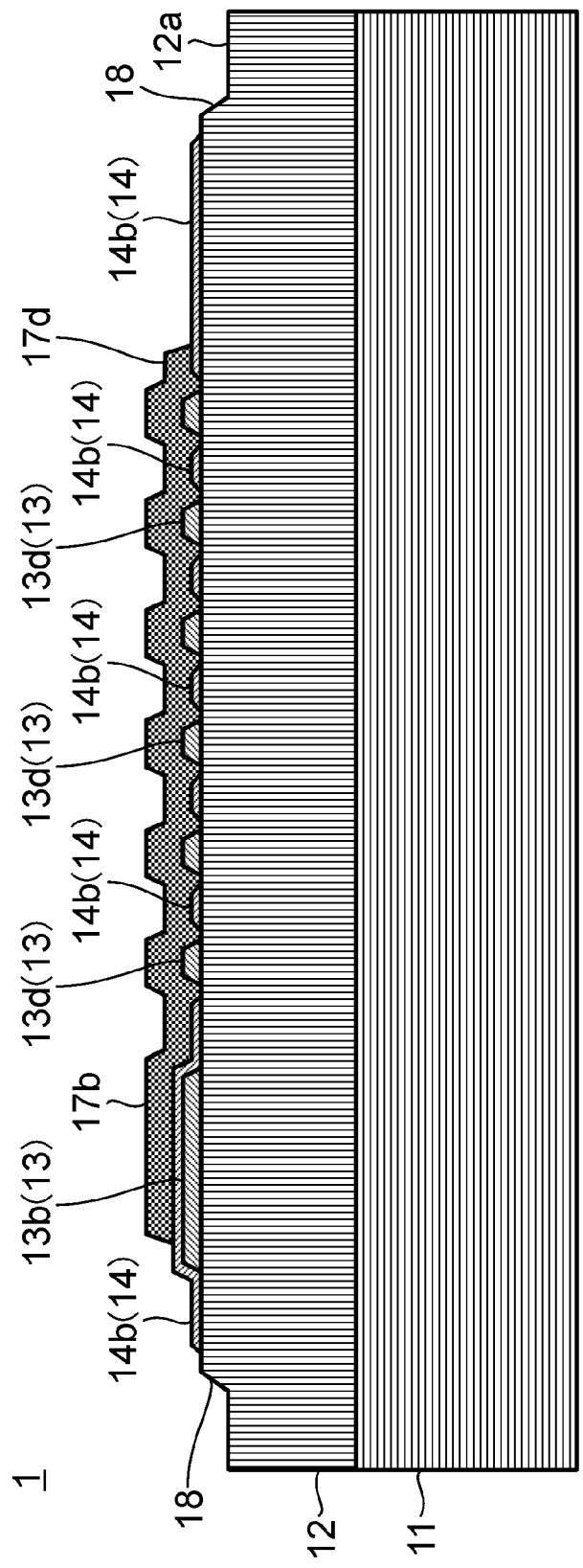
FIG. 40 is a sectional structure view of the nitride semiconductor light emitting element according to the thirteenth embodiment.
Figure 41:
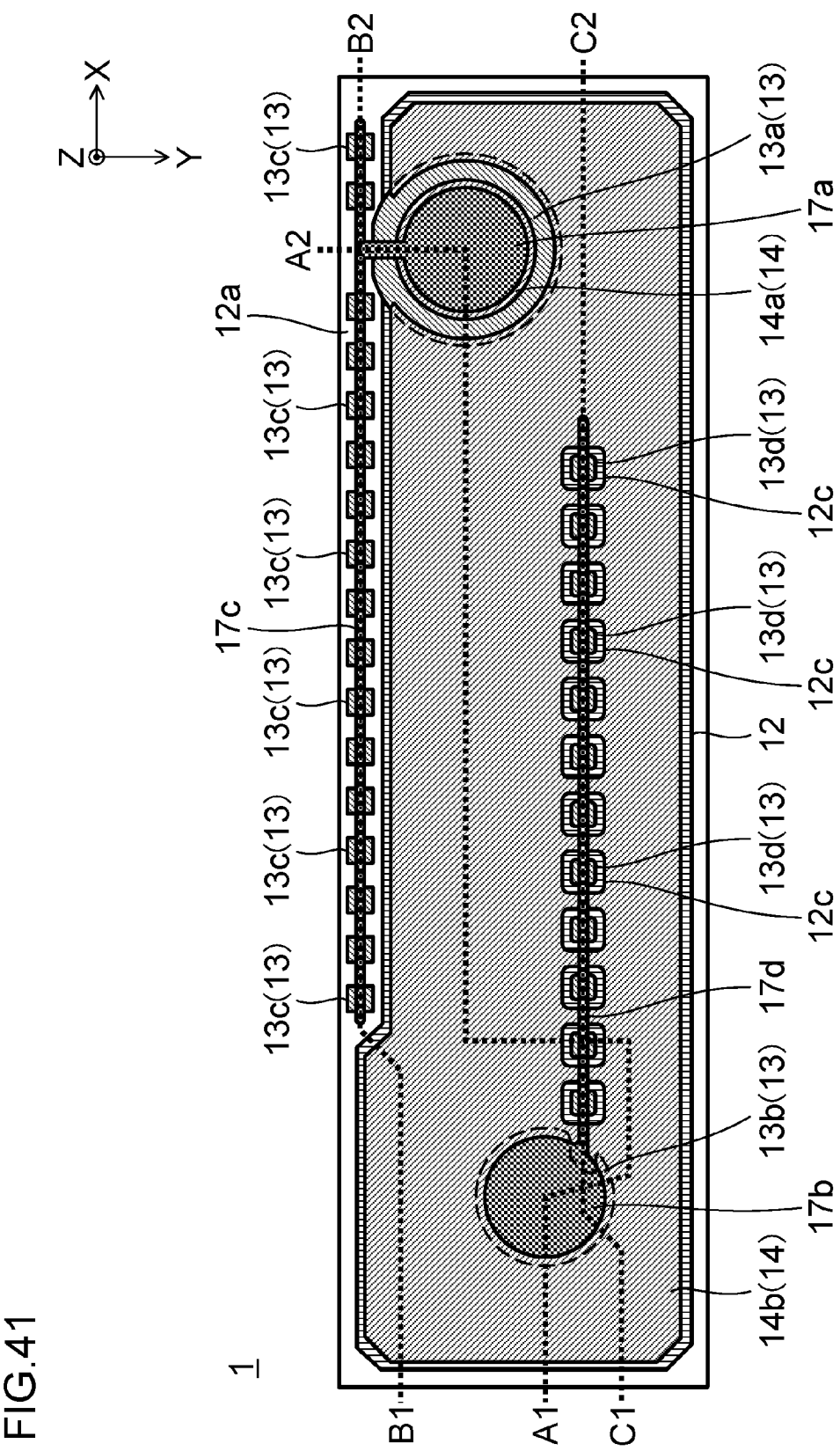
FIG. 41 is a top view of the nitride semiconductor light emitting element according to the thirteenth embodiment.

FIG. 38, FIG. 39, and FIG. 40 are sectional structure views of the nitride semiconductor light emitting element according to the thirteenth embodiment, and FIG. 41 is a top view of the nitride semiconductor light emitting element according to the thirteenth embodiment. FIG. 38 illustrates a sectional view taken along an A1-A2 line of FIG. 41, and FIG. 39 illustrates a sectional view taken along a B1-B2 line of FIG. 41, FIG. 40 illustrates a sectional view taken along a C1-C2 line of FIG. 41.

In the thirteenth embodiment, after stacking the current non-injection layer 13, using photolithography, the current non-injection layer, which is provided on a region other than the n-side electrode region and a region other than a region where the p-side electrode is formed, on the nitride semiconductor multilayered portion 12, is removed by etching. Accordingly, as illustrated in FIG. 38 to FIG. 41, the first current non-injection layer 13*a*, the second current non-injection layer 13*b*, the first current non-injection layer 13*c* formed on a region on the exposed portion 12*a* on the n-type nitride semiconductor layer, and the second current non-injection layer 13*d* formed on a region of the exposed portion 12*c* of the p-type nitride semiconductor layer are separately formed at the same time.

The first current non-injection layers 13c are formed to be scattered with predetermined intervals along the X direction in FIG. 41. Each of the plurality of first current non-injection layers 13c is formed in a rectangular shape when seen from the Z direction in FIG. 41, and becomes a trapezoidal shape when seen from the Y direction in FIG. 41 (refer to FIG. 39). The extending portion 17c of the n-side electrode 17a extends in a band shape which becomes a straight line along the X direction on an upper side of the first current non-injection layer 13c, so as to be over the plurality of first current non-injection layers 13c, which are scattered. The extending portion 17c of the n-side electrode 17a comes into contact with the n-type nitride semiconductor layer so as to be conducted thereto in a position between the plurality of first current non-injection layers 13c, which are scattered, or both end sides in the X direction.

The second current non-injection layers 13d are formed to be scattered with predetermined intervals along the X direction in FIG. 41. Each of the plurality of second current non-injection layers 13d is formed in a rectangular shape when seen from the Z direction in FIG. 41, and becomes a trapezoidal shape when seen from the Y direction and the X direction in FIG. 41 (refer to FIG. 38 and FIG. 40). The extending portion 17d of the p-side electrode 17b extends in a band shape which becomes a straight line along the X direction on an upper side of the second current non-injection layer 13d so as to be over a plurality of the scattered second current non-injection layers 13d. The extending portion 17d of the p-side electrode 17b comes into contact with the p-type nitride semiconductor layer so as to be conducted thereto in a position between the plurality of second current non-injection layers 13d, which are scattered, or both end sides in the X direction.

The embodiment differs from the fourth embodiment in that the plurality of second current non-injection layers 13d are formed on a region under the extending portion 17d of the p-side electrode 17b.

Generally, if the current non-injection layer is formed on the entire surface under the extending portion of the p-side electrode, compared to a case in which the current non-injection layer is not formed under the extending portion of the p-side electrode, light output of the nitride semiconductor light emitting element is improved with about 1.0 mW to 3.0 mW. However, since a non-light emitting region of the active layer is increased as much, depending on the ratio of the p-side electrode occupied in an upper surface of the nitride semiconductor multilayered portion, if a desired light output is intended to be obtained, there is a problem in that a value of injected current to the light emitting layer needs to be increased.

If a plurality of the current non-injection layers are formed on a region under the extending portion of the p-side electrode as the embodiment, light from the active layer can be emitted from even under the extending portion of the p-side electrode by injecting current, and light returning to the extending portion of the p-side electrode by the current non-injection layer can be also reflected efficiently at the same time. In addition, by providing the plurality of current non-injection layers, flowing-around of current under the current non-injection layer in an extending direction of the p-side electrode can be expected, and light emitting below (a part of) the plurality of current non-injection layers can be expected in a case of using the embodiment. Also, in a case where the extending portion of the p-side electrode needs to be formed in multiple in accordance with enlarging of an area of the nitride semiconductor light emitting element, compared to a case in which the current non-injection layer is formed on the entire surface under the extending portion of the p-side electrode, an effect of reducing voltage applied to the nitride semiconductor light emitting element can be expected by using a configuration of the embodiment.

In examples of the embodiment, if the second current non-injection layer 13d is partially formed under the extending portion 17d of the p-side electrode 17b, compared to a case in which the second current non-injection layer is not formed under the extending portion 17d of the p-side electrode 17b, the light output (mW) of the nitride semiconductor light emitting element 1 can be improved with about 0.5% to 1.5%.

Accordingly, when the plurality of second current non-injection layers 13d are formed in parallel under the extending portion 17d of the p-side electrode 17b, the light output can be improved without changing the value of applying voltage. The light output can be adjusted by changing a width (w) and a pitch (P) in the X direction in FIG. 41 of each of the plurality of second current non-injection layers 13d under the extending portion 17d of the p-side electrode 17b. In the embodiment, a maximum light output can be obtained at the time of a relationship of W/P 0.5. It is considered that the relationship is determined by a balance between an effect of current widening due to the current diffusing layer/an effect of light absorption in the current diffusing layer, and suppression of a light absorption in the p-side electrode due to the current non-injection layer.

Most of an effect of improving the light output of the embodiment can be defined by a light reflection effect at an interface between the nitride semiconductor multilayered portion 12 and the second current non-injection layer 13d. In the embodiment, in order to efficiently extract light entering inside the second current non-injection layer 13d to the nitride semiconductor multilayered portion 12 side again, a sectional shape when seen from the Y direction and the X direction in FIG. 41 of the second current non-injection layer 13d is configured to be in a trapezoid shape (refer to FIG. 38 and FIG. 40). However, a shape of the second current non-injection layer 13d is not limited thereto, and may be a shape in which an upper surface in FIG. 38 and FIG. 40 has a curved surface such as hemispherical, or may be a triangular pyramidal shape.

In this way, when a shape, a width, a pitch, and the like of the second current non-injection layer 13d are further researched, flowing-around of current to the active layer under the second current non-injection layer 13d can be expected, and increasing of the light emitting area of the active layer can be expected.

Hitherto, the invention has been described on the basis of the embodiments. Since the embodiments are examples, it is understood by skilled in the art that various modification examples can be applied to combination of each configuration component or each process, and are included in a range of the invention.

For example, regarding each epitaxial layer of the nitride semiconductor multilayered portion stacked on the substrate, a thickness, composition, and the like thereof can be appropriately combined or changed in accordance with a desired performance. In addition, in the embodiments described above, for example, the epitaxial layer may be added or removed, and a sequence of stacking the epitaxial layer may be partially changed. Also, a conductivity type regarding a part of the epitaxial layer may be changed.

In addition, in the embodiments described above, the first current diffusing layer and the second current diffusing layer, or the first current non-injection layer and the second current non-injection layer are simultaneously formed, but effects of the invention can be obtained except that the number of processes are increased, even when these layers are separately formed.

INDUSTRIAL APPLICABILITY

The present invention can be used for a light emitting element which is used for a backlight of a liquid crystal display apparatus, general lighting, or the like, as a high luminance light source, or the like.

REFERENCE SIGNS LIST

1 NITRIDE SEMICONDUCTOR LIGHT EMITTING ELEMENT
11 SUBSTRATE
12 NITRIDE SEMICONDUCTOR MULTILAYERED PORTION
12a and 12c EXPOSED PORTION
12b PROJECTION PORTION
13 CURRENT NON-INJECTION LAYER
13a and 13c FIRST CURRENT NON-INJECTION LAYER
13b and 13d SECOND CURRENT NON-INJECTION LAYER
14 CURRENT DIFFUSING LAYER
14a and 14c FIRST CURRENT DIFFUSING LAYER
14b SECOND CURRENT DIFFUSING LAYER
15 PROTECTIVE FILM
17a n-SIDE ELECTRODE (FIRST ELECTRODE)
17b p-SIDE ELECTRODE (SECOND ELECTRODE)
17c and 17d EXTENDING PORTION
18 STEPPED PORTION

The invention claimed is:

1. A nitride semiconductor light emitting element having an n-side electrode and a p-side electrode disposed on a light extraction side so that the nitride semiconductor light emitting element is mounted face-up, comprising:
a substrate;
a first conductivity type nitride semiconductor layer that is formed on the substrate;
an active layer that is formed on the first conductivity type nitride semiconductor layer;
a second conductivity type nitride semiconductor layer that is formed on the active layer;
an exposed portion on the first conductivity type nitride semiconductor layer that is exposed by removing a part of the second conductivity type nitride semiconductor layer and the active layer;
a first current non-injection layer that is formed on a region on the second conductivity type nitride semiconductor layer;
a first current diffusing layer that is formed on the first current non-injection layer;
a second current diffusing layer that is formed on another region on the second conductivity type nitride semiconductor layer;
a first electrode that is formed on the first current diffusing layer;
a second electrode that is formed on the second current diffusing layer; and
an extending portion of the first electrode that extends from the first electrode and is formed to reach a part of the exposed portion on the first conductivity type nitride semiconductor layer, wherein
the second current diffusing layer is not formed under the first electrode.

2. The nitride semiconductor light emitting element according to claim 1, further comprising:
a second current non-injection layer that is formed between the other region of the second conductivity type nitride semiconductor layer and the second current diffusing layer.

3. The nitride semiconductor light emitting element according to claim 1, further comprising:
an extending portion of the second electrode which extends from the second electrode and is formed on the second conductivity type nitride semiconductor layer.

4. The nitride semiconductor light emitting element according to claim 1,
wherein the first current non-injection layer is formed on a region on the second conductivity type nitride semiconductor layer, and on a region of the exposed portion on the first conductivity type nitride semiconductor layer.

5. The nitride semiconductor light emitting element according to claim 1,
wherein the first current diffusing layer is formed on only a region of the second conductivity type nitride semiconductor layer.

6. The nitride semiconductor light emitting element according to claim 1,
wherein the first current diffusing layer is formed below the first electrode and the extending portion of the first electrode.

7. The nitride semiconductor light emitting element according to claim 6,
wherein, the first current diffusing layer is separately formed below the first electrode and below the extending portion of the first electrode in a stepped portion which is formed from an upper surface of the second conductivity type nitride semiconductor layer to reach the exposed portion on the first conductivity type nitride semiconductor layer.

8. A method of manufacturing the nitride semiconductor light emitting element according to claim 1, the method comprising:
simultaneously forming the first current diffusing layer and the second current diffusing layer.

9. A method of manufacturing the nitride semiconductor light emitting element according to claim 2, the method comprising:
simultaneously forming the first current non-injection layer and the second current non-injection layer.

* * * * *